(12) United States Patent
Kimoto

(10) Patent No.: US 12,519,429 B2
(45) Date of Patent: Jan. 6, 2026

(54) HIGH FREQUENCY AMPLIFIER

(71) Applicant: Sumitomo Electric Device Innovations, Inc., Yokohama (JP)

(72) Inventor: Yuji Kimoto, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 622 days.

(21) Appl. No.: 17/916,857

(22) PCT Filed: Apr. 20, 2021

(86) PCT No.: PCT/JP2021/016063
§ 371 (c)(1),
(2) Date: Oct. 4, 2022

(87) PCT Pub. No.: WO2021/215443
PCT Pub. Date: Oct. 28, 2021

(65) Prior Publication Data
US 2023/0163731 A1    May 25, 2023

(30) Foreign Application Priority Data
Apr. 23, 2020   (JP) ................... 2020-076598

(51) Int. Cl.
*H03F 1/56*     (2006.01)
*H03F 3/193*    (2006.01)

(52) U.S. Cl.
CPC .............. *H03F 1/56* (2013.01); *H03F 3/193* (2013.01); *H03F 2200/451* (2013.01)

(58) Field of Classification Search
CPC ...... H03F 1/56; H03F 3/193; H03F 2200/451; H01L 2223/6611; H01L 2223/6655; H01L 23/66
(Continued)

(56) References Cited

U.S. PATENT DOCUMENTS 11,522,500 B2 * 12/2022 Roiz .................. H03F 3/195
2016/0322942 A1 * 11/2016 Lang ................... H03F 3/21
(Continued)

FOREIGN PATENT DOCUMENTS

JP   63-086904 A    4/1988
JP   2014-222836 A  11/2014
(Continued)

*Primary Examiner* — Andrea Lindgren Baltzell
*Assistant Examiner* — Nareh Shamiryan
(74) *Attorney, Agent, or Firm* — Volpe Koenig

(57) ABSTRACT

A high frequency amplifier includes a first transistor and a second transistor, a first drain pad connected to the first transistor and a second drain pad connected to the second transistor, a matching circuit pattern having a first transmission line connected to the first drain pad and a second transmission line connected to the second drain pad, a first wire and a second wire, and a wiring pattern connected to the first drain pad via the first transmission line and the first wire and connected to the second drain pad via the second transmission line and the second wire. An effective impedance of the second wire is larger than an effective impedance of the first wire. The matching circuit pattern has an asymmetrical external shape. An electrical length of the second transmission line is shorter than an electrical length of the first transmission line.

5 Claims, 21 Drawing Sheets

(58) Field of Classification Search
USPC .......................................................... 330/307
See application file for complete search history.

(56) References Cited

U.S. PATENT DOCUMENTS

| | | | |
|---|---|---|---|
| 2018/0130764 A1 | 5/2018 | Chaki | |
| 2018/0183388 A1* | 6/2018 | Pham | ........................ H03F 1/56 |
| 2020/0076378 A1 | 3/2020 | Minami | |
| 2020/0259461 A1* | 8/2020 | Bouisse | .................. H03F 3/245 |
| 2021/0091723 A1* | 3/2021 | Yoshioka | ................ H03F 1/565 |

FOREIGN PATENT DOCUMENTS

| | | |
|---|---|---|
| JP | 2018-078487 A | 5/2018 |
| JP | 2020-036153 A | 3/2020 |

* cited by examiner

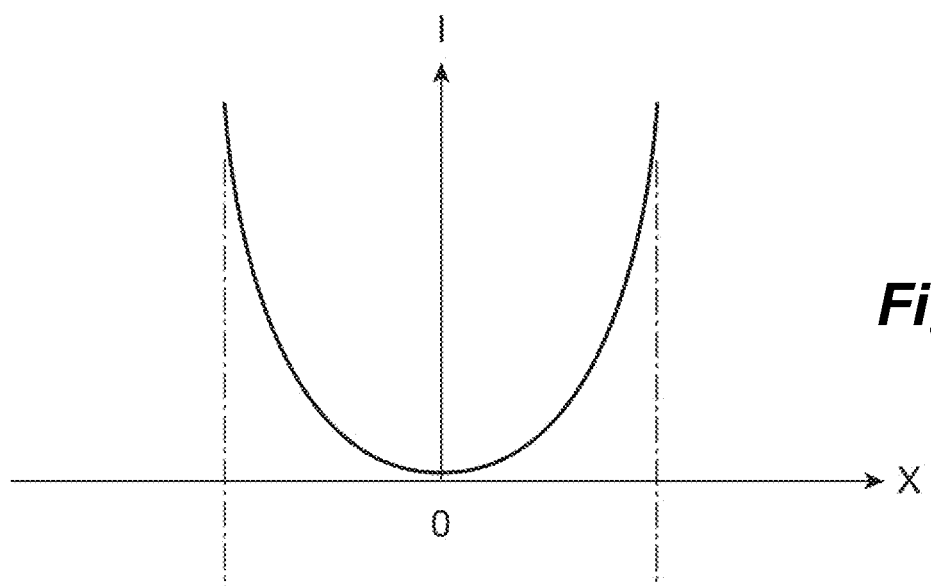
Fig. 9B
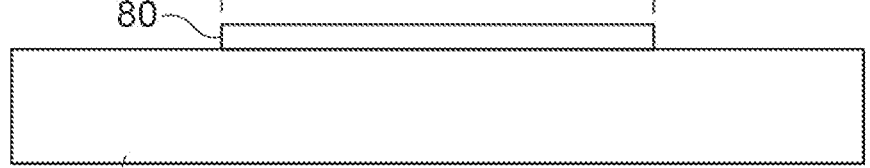
Fig. 9A
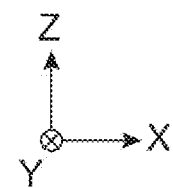

Fig.11
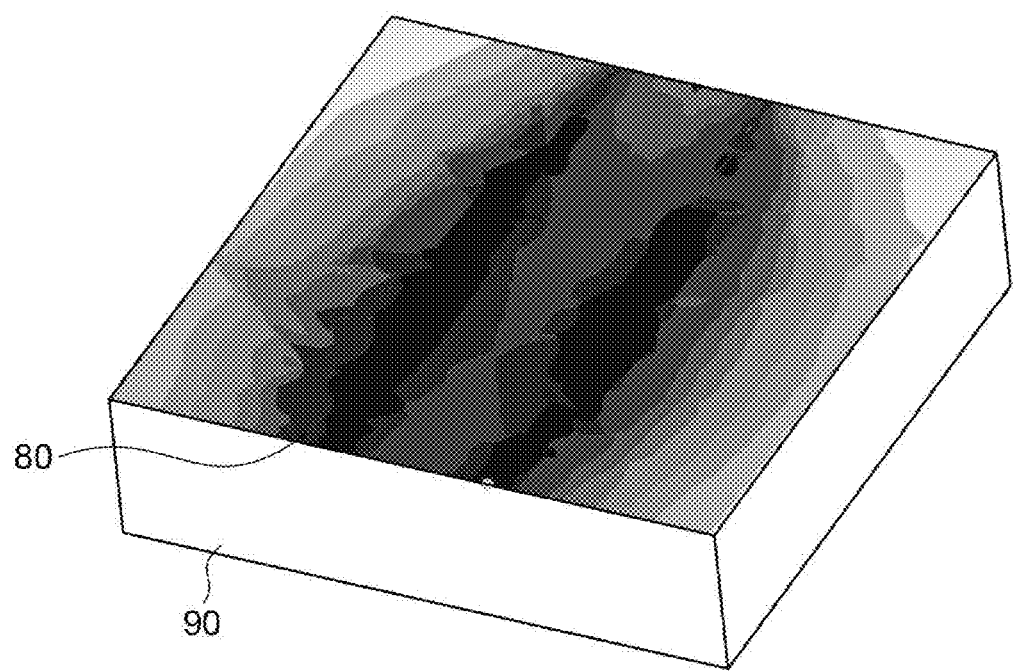
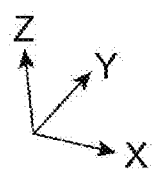

HIGH FREQUENCY AMPLIFIER

TECHNICAL FIELD

The present disclosure relates to a high frequency amplifier. This application claims the benefit of priority from Japanese Patent Application No. 2020-076598, filed on Apr. 23, 2020, the entire contents of which are incorporated herein by reference.

BACKGROUND ART

Regarding a high frequency amplifier, for example, Patent Literature 1 discloses a technology related to a field effect transistor (FET). This field effect transistor includes a plurality of amplifier elements for amplifying a radio frequency (RF) signal, and a matching circuit connected to input ends of the amplifier elements and an input terminal of a package via bonding wires and performing impedance conversion.

CITATION LIST

Patent Literature

[Patent Literature 1] Japanese Unexamined Patent Publication No. S63-86904

SUMMARY OF INVENTION

The present disclosure provides a high frequency amplifier. This high frequency amplifier includes a first transistor, a second transistor arranged side by side with the first transistor in a first direction, and a third transistor arranged side by side with the second transistor in the first direction on a side opposite to the first transistor; a first drain pad electrically connected to a drain electrode of the first transistor, a second drain pad electrically connected to a drain electrode of the second transistor, and a third drain pad electrically connected to a drain electrode of the third transistor; a matching circuit pattern including a first transmission line electrically connected to the first drain pad, a second transmission line electrically connected to the second drain pad, and a third transmission line electrically connected to the third drain pad, the matching circuit pattern performing impedance matching of a radio frequency signal with respect to each of the first transistor, the second transistor, and the third transistor; a first wire that electrically connects the first transmission line and the first drain pad to each other, a second wire that electrically connects the second transmission line and the second drain pad to each other, and a third wire that electrically connects the third transmission line and the third drain pad to each other; and a wiring pattern electrically connected to the first drain pad via the first transmission line and the first wire and electrically connected to the second drain pad via the second transmission line and the second wire. An effective impedance of the second wire is larger than an effective impedance of the first wire. The matching circuit pattern has an asymmetrical external shape with respect to a second virtual straight line orthogonal to a first virtual straight line connecting a first connection point having the first wire connected thereto in the first transmission line and a second connection point having the second wire connected thereto in the second transmission line to each other and passing through a median point between the first connection point and the second connection point. An electrical length of the second transmission line is shorter than an electrical length of the first transmission line.

BRIEF DESCRIPTION OF DRAWINGS

FIGS. 9A and 9B are an explanatory view of a distribution state of currents in microwaves.

FIG. 11 is a view of a simulation illustrating a distribution state of electric field intensities in microwaves.

DESCRIPTION OF EMBODIMENTS

Figure 1:
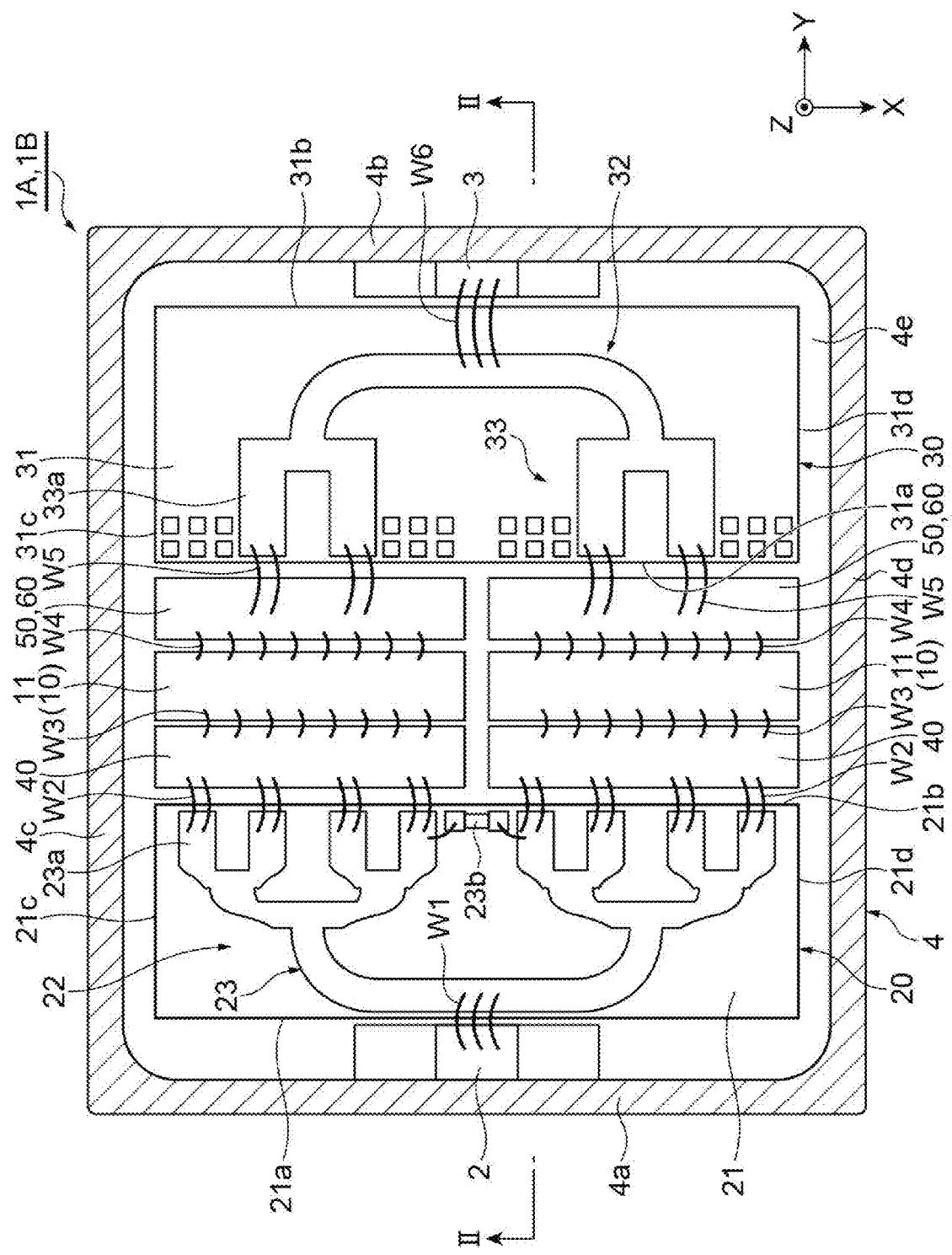
FIG. 1 is a plan view illustrating an internal constitution of a high frequency amplifier 1A according to a first embodiment and a high frequency amplifier 1B according to a second embodiment.

Problem to Be Solved By Present Disclosure

In the high frequency amplifier disclosed in Patent Literature 1, a plurality of transistors are disposed in parallel in an amplifier element, and each of the transistors is connected to a matching circuit through a wire such as a bonding wire. In such a case, mutual inductance components of a plurality of respective wires receive an influence from a different wire close thereto. Accordingly, variation may occur in an effective impedance between a plurality of wires in accordance with the degree of an influence received from a different wire. At this time, since the phase of an RF signal varies between a plurality of wires, there is concern that variation may also occur in the phase of the RF signal between a plurality of transistors. In order to improve electric power efficiency of the high frequency amplifier, it is desirable to reduce this variation in phase of the RF signal.

Effects of Present Disclosure

According to a high frequency amplifier of an embodiment of the present disclosure, it is possible to reduce variation in phase of an RF signal between a plurality of transistors.

Description of Embodiment of Present Disclosure

First, details of an embodiment of the present disclosure will be enumerated and described. A high frequency amplifier according to the embodiment includes a first transistor, a second transistor arranged side by side with the first transistor in a first direction, and a third transistor arranged side by side with the second transistor in the first direction on a side opposite to the first transistor; a first drain pad electrically connected to a drain electrode of the first transistor, a second drain pad electrically connected to a drain electrode of the second transistor, and a third drain pad electrically connected to a drain electrode of the third transistor; a matching circuit pattern including a first transmission line electrically connected to the first drain pad, a second transmission line electrically connected to the second drain pad, and a third transmission line electrically connected to the third drain pad, the matching circuit pattern performing impedance matching of a radio frequency signal with respect to each of the first transistor, the second transistor, and the third transistor; a first wire that electrically connects the first transmission line and the first drain pad to each other, a second wire that electrically connects the second transmission line and the second drain pad to each other, and a third wire that electrically connects the third transmission line and the third drain pad to each other; and a wiring pattern electrically connected to the first drain pad via the first transmission line and the first wire and electrically connected to the second drain pad via the second transmission line and the second wire. An effective impedance of the second wire is larger than an effective impedance of the first wire. The matching circuit pattern has an asymmetrical external shape with respect to a second virtual straight line orthogonal to a first virtual straight line connecting a first connection point having the first wire connected thereto in the first transmission line and a second connection point having the second wire connected thereto in the second transmission line to each other and passing through a median point between the first connection point and the second connection point. An electrical length of the second transmission line is shorter than an electrical length of the first transmission line.

In this high frequency amplifier, each of the first transistor, the second transistor, and the third transistor serving as a plurality of transistors is connected to the matching circuit pattern through the first wire, the second wire, and the third wire serving as a plurality of wires. In this constitution, variation may occur in the effective impedance between the plurality of wires in accordance with the degree of an influence received from a different wire. Such variation in effective impedance between a plurality of wires is manifested as variation in electrical length between the plurality of wires. Here, in this high frequency amplifier, since the matching circuit pattern has an asymmetrical external shape, the electrical length of the second transmission line is shorter than the electrical length of the first transmission line. Accordingly, in a constitution in which the electrical length of the second wire is longer than the electrical length of the first wire, an electrical length difference between the wires can be canceled out by an electrical length difference between the transmission lines. Therefore, variation between the electrical length from the first transistor to the wiring pattern and the electrical length from the second transistor to the wiring pattern is reduced. If variation in electrical length between a plurality of wires is reduced, variation in effective impedance between the plurality of wires is reduced. Therefore, due to this constitution, variation in phase can be reduced between the first transistor and the second transistor.

In the foregoing high frequency amplifier, the matching circuit pattern may include a first pad including a first corner portion and a second pad including a second corner portion. The first transmission line may be constituted of a part including the first corner portion in the first pad. The second transmission line may be constituted of a part including the second corner portion in the second pad. The second corner portion may be chamfered by a chamfering amount larger than a chamfering amount of the first corner portion. According to knowledge of this inventor, currents (electric field) in a radio frequency are likely to be concentrated at an outer edge of a conductor. For this reason, in the first transmission line, a radio frequency signal is propagated along the first corner portion in the first pad. In the second transmission line, a radio frequency signal is propagated along the second corner portion in the second pad. Here, since the second corner portion is chamfered by a chamfering amount larger than the chamfering amount of the first corner portion, the path including the second corner portion becomes shorter than the path including the first corner portion, and thus a constitution in which the electrical length of the second transmission line is shorter than the electrical length of the first transmission line may be realized. According to this constitution, the electrical length from the first transistor to the wiring pattern and the electrical length from the second transistor to the wiring pattern are likely to be subjected to matching through adjustment of the chamfering amount. Therefore, variation in phase between the first transistor and the second transistor can be more reliably reduced.

In the foregoing high frequency amplifier, the first transmission line may be thinner than the second transmission line. In this case, since the impedance per unit length of the first transmission line can become higher than the impedance per unit length of the second transmission line, a constitution in which the electrical length of the second transmission line is shorter than the electrical length of the first transmission line may be realized. According to the degree of thinning of the first transmission line, the electrical length from the first transistor to the wiring pattern and the electrical length from the second transistor to the wiring pattern are likely to be subjected to matching. Therefore, variation in phase between the first transistor and the second transistor can be more reliably reduced.

In the foregoing high frequency amplifier, a plurality of transistor groups each including the first transistor, the second transistor, and the third transistor may be provided. In this case, a high frequency amplifier having a high output can be realized.

In the foregoing high frequency amplifier, the first wire may be disposed at an outermost part of the transistor groups, and the second wire may be disposed between the third wire and the first wire. A length of the first wire may be equivalent to a length of the second wire. An effective electrical length from the first drain pad to the wiring pattern may be substantially equivalent to an effective electrical length from the second drain pad to the wiring pattern. In this case, since the phases substantially coincide with each other between the first transistor and the second transistor, this is particularly advantageous from the viewpoint of improving the electric power efficiency of the high frequency amplifier.

Details of Embodiment of Present Disclosure

A specific example of a high frequency amplifier according to an embodiment of the present disclosure will be described below with reference to the drawings. The present disclosure is not limited to these examples. The present disclosure is indicated by the claims, and it is intended to include all changes within meanings and a range equivalent to the claims. In the following description, the same reference signs are applied to the same elements or elements having the same function, and duplicate description thereof may be omitted. In the description, the XYZ orthogonal coordinate system indicated in the drawings may be referred to.

FIG. 1 is a plan view illustrating an internal constitution of a high frequency amplifier 1A according to a first embodiment and a high frequency amplifier 1B according to a second embodiment. First, the high frequency amplifier 1A according to the first embodiment will be described. The high frequency amplifier 1A includes one input terminal 2, one output terminal 3, an amplifier element portion 10, a branching circuit substrate 20, a synthetic circuit board 30, matching circuits 40, and matching circuits 50. In the present embodiment, as an example, the high frequency amplifier 1A includes two of each of the matching circuits 40 and 50. The amplifier element portion 10 includes two amplifier elements 11. For example, an output for one amplifier element 11 is 30 W, and for example, an output of the entire amplifier element portion 10 is 60 W. The high frequency amplifier 1A includes a package 4 accommodating the amplifier element portion 10, the branching circuit substrate 20, the synthetic circuit board 30, and the matching circuits 40 and 50, and bonding wires W1, W2, W3, W4, W5, and W6.

The package 4 is made of metal and is connected to a reference potential. The planar shape of the package 4 is substantially a rectangular shape. The package 4 has side walls 4c and 4d facing each other in a first direction, and end walls 4a and 4b facing each other in a second direction. The first direction and the second direction intersect each other and are orthogonal to each other in the example. In the present embodiment, the first direction is an X axis direction, and the second direction is a Y axis direction.

The package 4 has a flat bottom plate 4e having a rectangular shape. The bottom plate 4e extends along a plane defined in the Y axis direction and the X axis direction. The end walls 4a and 4b stand upright along a pair of sides of the bottom plate 4e (sides extending in the X axis direction), and the side walls 4c and 4d stand upright along another pair of sides of the bottom plate 4e (sides extending in the Y axis direction). The package 4 further has a lid portion (not illustrated). The lid portion seals an upper opening formed by the end walls 4a and 4b and the side walls 4c and 4d.

The input terminal 2 is a metal wiring pattern, and a radio frequency signal is input therethrough from the outside of the high frequency amplifier 1A. A radio frequency signal is a signal based on a multi-carrier transmission method and is realized by superimposing a plurality of signals in which frequencies of carrier signals are different from each other. For example, a frequency band of a carrier signal is 500 MHz or lower. The input terminal 2 is provided at a middle portion of the end wall 4a in the X axis direction and extends from the outside to the inside of the package 4.

The output terminal 3 is a metal wiring pattern, and an amplified radio frequency signal is output therethrough to the outside of the high frequency amplifier 1A. The output terminal 3 is provided at a middle portion of the end wall 4b in the X axis direction and extends from the inside to the outside of the package 4.

The amplifier element portion 10 is disposed on the bottom plate 4e of the package 4 and substantially at a middle part of the package 4 in the Y axis direction. The two amplifier elements 11 in the amplifier element portion 10 are disposed side by side in the X axis direction. Each of the amplifier elements 11 includes a plurality of transistors 13 (refer to FIG. 2). For example, the plurality of transistors 13 are field effect transistors (FETs) and are high electron mobility transistors (HEMTs) in one example. Each of the plurality of transistors 13 has a gate electrode, a source electrode, and a drain electrode. Each of the transistors 13 amplifies an input radio frequency signal and outputs an amplified radio frequency signal. A more specific constitution of the amplifier element 11 will be described below.

The branching circuit substrate 20 is disposed on the bottom plate 4e of the package 4. The branching circuit substrate 20 is disposed side by side with the input terminal 2 and the amplifier element portion 10 in the Y axis direction and is positioned between the input terminal 2 and the amplifier element portion 10. The branching circuit substrate 20 has a ceramic substrate 21 and a branching circuit 22 provided on a main surface of the substrate 21. For example, the planar shape of the substrate 21 is a rectangular shape. A long side 21a thereof on one side faces the input terminal 2, and a long side 21b thereof on the other side faces the amplifier element portion 10 via the matching circuits 40. A rear surface of the substrate 21 faces the bottom plate 4e of the package 4. A short side 21c of the substrate 21 on one side is positioned in the vicinity of the side wall 4c of the package 4, and a short side 21d of the substrate 21 on the other side is positioned in the vicinity of the side wall 4d of the package 4. That is, the substrate 21 extends from an area in the vicinity of one end to an area in the vicinity of the other end of the package 4 in the X axis direction.

The branching circuit 22 includes a wiring pattern 23 provided on the main surface of the substrate 21. The wiring pattern 23 is electrically connected to the input terminal 2 via the bonding wires W1. A radio frequency signal is input to the wiring pattern 23 from a middle portion of the substrate 21 in the X axis direction. The wiring pattern 23 has a line-symmetrical shape with respect to a centerline of the substrate 21 in the Y axis direction. The wiring pattern 23 repeats bifurcation at a connection point with respect to the bonding wires W1 as a starting point and ultimately reaches eight metal pads 23a. The eight metal pads 23a are arrayed side by side along the long side 21b. Metal pads 23a adjacent to each other are connected to each other via a film resistor and constitute Wilkinson couplers. Accordingly, while isolation between a plurality of gate pads 14 (which will be described below) of the amplifier element portion 10 is secured, matching of an input impedance of the amplifier element portion 10 viewed from the input terminal 2 is achieved. In the diagram, only one film resistor 23b is representatively illustrated. The eight metal pads 23a are electrically connected to the matching circuits 40 via the bonding wires W2.

The matching circuits 40 are disposed on the bottom plate 4e of the package 4 and are disposed between the branching circuit substrate 20 and the amplifier element portion 10 in the Y axis direction. For example, each of the matching circuits 40 is a die capacitor, and has a dielectric substrate and a circuit pattern (not illustrated) provided on a main surface of the dielectric substrate. The circuit pattern has a plurality of metal pads (not illustrated). For example, the number of metal pads is the same as the number of metal pads 23a. The plurality of metal pads are arrayed in a row in the X axis direction. Each of the metal pads is electrically connected to the corresponding metal pad 23a via the bonding wires W2 and is electrically connected to the corresponding gate pad 14 of the amplifier element portion 10 via the bonding wire W3.

In the matching circuits 40, T-type filter circuits are constituted of inductance components by the bonding wires W2 and the bonding wires W3, and capacitance of metal pads connected between a node between these inductance components and the reference potential (bottom plate 4e). The matching circuits 40 perform impedance conversion through these T-type filter circuits. Normally, estimated impedances inside the transistors 13 from the gate pads 14 in the amplifier element portion 10 differ from a characteristic impedance (for example, 50Ω) of a transmission line. The matching circuits 40 convert the impedances into an estimated impedance 50Ω inside the package 4 from the input terminal 2 through the T-type filter circuits.

Figure 2:
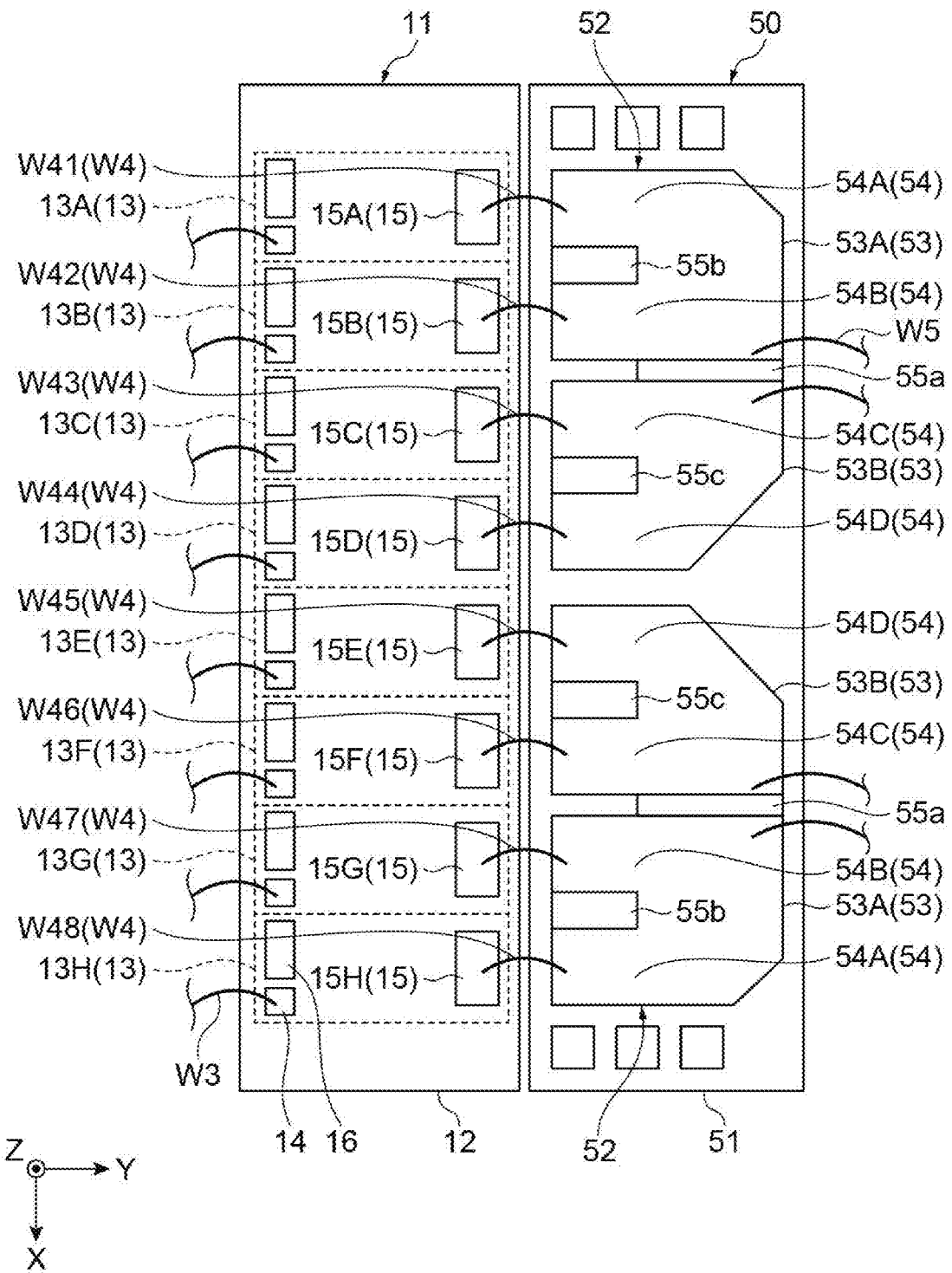
FIG. 2 is a plan view illustrating an amplifier element 11 and a matching circuit 50.

The matching circuits 50 are disposed on the bottom plate 4e of the package 4 and are disposed between the amplifier element portion 10 and the synthetic circuit board 30 in the Y axis direction. For example, similar to the matching circuits 40, the matching circuits 50 are parallel flat plate-type capacitor (die capacitors). As illustrated in FIG. 2, each of the matching circuits 50 has a dielectric substrate 51 (refer to FIG. 2) and a plurality of matching circuit patterns 52 (refer to FIG. 2) provided on the dielectric substrate 51. The planar shape of the dielectric substrate 51 is a rectangular shape having the X axis direction as a longitudinal direction. For example, the thickness (here, the dimension in a Z axis direction) of the dielectric substrate 51 is approximately 200 μm. For example, a relative dielectric constant (εr) of the dielectric substrate 51 is εr=150. Each of the matching circuit patterns 52 has a plurality of metal pads 53. Each of the metal pads 53 is electrically connected to a corresponding drain pad 15 (which will be described below) of the amplifier element portion 10 via the bonding wire W4 (wire) and is electrically connected to a corresponding metal pad 33a (which will be described below) of the synthetic circuit board 30 via the bonding wire W5. A more specific constitution of the matching circuit 50 will be described below.

Also in the matching circuits 50, T-type filter circuits (matching circuits) are constituted of inductance components by the bonding wires W4 and the bonding wires W5, and a capacitance of the metal pad 53 connected to between a node between these inductance components and the reference potential (bottom plate 4e). The matching circuits 50 achieve impedance matching with respect to the amplifier element portion 10 by performing impedance conversion through these T-type filter circuits. Normally, estimated impedances inside the transistors 13 from the drain pads 15 in the amplifier element portion 10 differ from the characteristic impedance (for example, 50Ω) of the transmission line and are generally values smaller than 50Ω. The matching circuits 50 cause the impedances to match an estimated impedance 50Ω inside the package 4 from the output terminal 3 through the T-type filter circuits.

The synthetic circuit board 30 is disposed on the bottom plate 4e of the package 4. The synthetic circuit board 30 is disposed side by side with the amplifier element portion 10 and the output terminal 3 in the Y axis direction and is positioned between the amplifier element portion 10 and the output terminal 3. The synthetic circuit board 30 has a ceramic substrate 31 and a synthetic circuit 32 provided on a main surface of the substrate 31. For example, the planar shape of the substrate 31 is a rectangular shape. Along side 31a thereof on one side faces the amplifier element portion 10 via the matching circuits 50, and a long side 31b thereof on the other side faces the output terminal 3. A rear surface of the substrate 31 faces the bottom plate 4e of the package 4. A short side 31c of the substrate 31 on one side is positioned in the vicinity of the side wall 4c of the package 4, and a short side 31d of the substrate 31 on the other side is positioned in the vicinity of the side wall 4d of the package 4. That is, the substrate 31 extends from an area in the vicinity of one end to an area in the vicinity of the other end of the package 4 in the X axis direction.

The synthetic circuit 32 synthesizes signals output from a plurality of drain pads 15 of the amplifier element portion 10 as one output signal. The synthetic circuit 32 includes a wiring pattern 33 provided on the main surface of the substrate 31. The wiring pattern 33 has a line-symmetrical shape with respect to a centerline of the substrate 31 in the Y axis direction. The wiring pattern 33 includes four metal pads 33a. The four metal pads 33a are arrayed side by side along the long side 31a. Metal pads 33a adjacent to each other are connected to each other via a film resistor and constitute Wilkinson couplers. Accordingly, while isolation between the plurality of drain pads 15 of the amplifier element portion 10 is secured, matching of an output impedance of the amplifier element portion 10 viewed from the output terminal 3 is achieved. Each of the metal pads 33a is electrically connected to two corresponding metal pads 53 of the matching circuit 50 via the bonding wires W5. The wiring pattern 33 ultimately reaches a connection point with respect to the bonding wires W6 while repeating coupling from the four metal pads 33a. The wiring pattern 33 is electrically connected to the output terminal 3 via the bonding wires W6. An amplified radio frequency signal is output to the output terminal 3 from a middle portion of the substrate 31 in the X axis direction.

Next, with reference to FIG. 2, the amplifier element 11 and the matching circuit 50 will be more specifically described. FIG. 2 is a plan view illustrating the amplifier element 11 and the matching circuit 50 in FIG. 1. The amplifier element 11 includes a semiconductor substrate 12, a plurality of transistors 13, a plurality of gate pads 14, a plurality of drain pads 15, and a plurality of source pads 16. The planar shape of the semiconductor substrate 12 is a rectangular shape having the X axis direction as a longitudinal direction. The plurality of transistors 13 are disposed side by side in the X axis direction on the semiconductor substrate 12. Each of the numbers of gate pads 14, drain pads 15, and source pads 16 is the same as the number of transistors 13. Each of the plurality of gate pads 14, the plurality of drain pads 15, and the plurality of source pads 16 is a metal film (for example, Au film) formed on a main surface of the semiconductor substrate 12.

The plurality of gate pads 14 are electrically connected to the respective gate electrodes of the plurality of transistors 13. The plurality of gate pads 14 are disposed side by side along an end side of each of the amplifier elements 11 on the input terminal 2 side. The plurality of drain pads 15 are electrically connected to the respective drain electrodes of the plurality of transistors 13. The plurality of drain pads 15 are disposed side by side along an end side of each of the amplifier elements 11 on the output terminal 3 side. The plurality of source pads 16 are electrically connected to the respective source electrodes of the plurality of transistors 13. The plurality of source pads 16 are alternately disposed side by side with the gate pads 14 along the end side of each of the amplifier elements 11 on the input terminal 2 side. Each of the source pads 16 is electrically connected to the bottom plate 4e of the package 4 via a via-hole penetrating the amplifier element 11 in a thickness direction (here, the Z axis direction) and serves as a reference potential. Each of the transistors 13 amplifies a radio frequency signal input to each of the gate pads 14 and outputs an amplified radio frequency signal from each of the drain pads 15.

In FIG. 2, one amplifier element 11 is illustrated. In the present embodiment, one amplifier element 11 has a transistor group constituted of eight transistors 13. Namely, in the high frequency amplifier 1A, a plurality of transistor groups (two in the present embodiment) are provided on the bottom plate 4e of the package 4. The eight transistors 13 include transistors 13A, 13B, 13C, 13D, 13E, 13F, 13G, and 13H which are arranged side by side in this order in the X axis direction. In other words, the transistor 13D is arranged side by side with the transistor 13A in the X axis direction, and the transistors 13E, 13F, 13G, and 13H are arranged side by side with the transistor 13D on a side opposite to the transistor 13A in the X axis direction. The transistor 13A is an example of a first transistor according to the present embodiment, and the transistor 13D is an example of a second transistor according to the present embodiment. Each of the transistors 13E, 13F, 13G, and 13H according to the present embodiment is an example of a third transistor. Each of the transistors 13A and 13H of the eight transistors 13 is disposed at an outermost part in the X axis direction. The transistor 13B to the transistor 13G are disposed between the transistors 13A and 13H. Namely, a different transistor 13 is adjacent to the transistors 13A and 13H on only one side thereof in the X axis direction. Different transistors 13 are adjacent to the transistor 13B to the transistor 13G on both sides thereof in the X axis direction.

Hereinafter, the drain pads 15 electrically connected to the respective drain electrodes of the transistor 13A to the transistor 13H will be respectively referred to as drain pads 15A, 15B, 15C, 15D, 15E, 15F, 15G, and 15H. The drain pad 15A is an example of a first drain pad according to the present embodiment, and the drain pad 15D is an example of a second drain pad according to the present embodiment. Each of the drain pads 15E, 15F, 15G, and 15H is an example of a third drain pad according to the present embodiment.

Hereinafter, the eight bonding wires W4 corresponding to the drain pad 15A to the drain pad 15H will be respectively referred to as bonding wires W41, W42, W43, W44, W45, W46, W47, and W48. The bonding wire W41 is an example of a first wire according to the present embodiment, and the bonding wire W44 is an example of a second wire according to the present embodiment. Each of the bonding wires W45, W46, W47, and W48 is an example of a third wire according to the present embodiment. The lengths of the eight bonding wires W4 are equivalent to each other. Each of the bonding wires W41 and W48 of the eight bonding wires W4 is disposed at an outermost part in the X axis direction. The bonding wire W42 to the bonding wire W47 are disposed between the bonding wires W41 and W48.

In the present embodiment, one matching circuit 50 has two matching circuit patterns 52. Each of the matching circuit patterns 52 has a plurality of transmission lines 54. In the two matching circuit patterns 52, the number of a plurality of transmission lines 54 is the same as the number of transistors 13. In the present embodiment, one matching circuit pattern 52 has four transmission lines 54. The four transmission lines 54 includes transmission lines 54A, 54B, 54C, and 54D.

The two matching circuit patterns 52 have mutually inverted constitutions with respect to the X axis direction. In the matching circuit pattern 52 on one side, the transmission lines 54A, 54B, 54C, and 54D corresponding to the transistors 13A, 13B, 13C, and 13D are arranged side by side in this order in the X axis direction. The transmission line 54A in the matching circuit pattern 52 on one side is an example of a first transmission line according to the present embodiment. The transmission line 54D in the matching circuit pattern 52 on one side is an example of a second transmission line according to the present embodiment. In the matching circuit pattern 52 on the other side, the transmission lines 54D, 54C, 54B, and 54A corresponding to the transistors 13E, 13F, 13G, and 13H are arranged side by side in this order in the X axis direction. Each of the transmission lines 54D, 54C, 54B, and 54A in the matching circuit pattern 52 on the other side is an example of a third transmission line according to the present embodiment. In the eight transmission lines 54, each of two transmission lines 54A is disposed at an outermost part in the X axis direction. Each of the transmission lines 54B, 54C, and 54D is disposed between the two transmission lines 54A.

The transmission lines 54A and 54B are constituted of a metal pad 53A (first pad) which is the metal pad 53 described above. The transmission lines 54C and 54D are constituted of a metal pad 53B (second pad) which is the metal pad 53 described above. The metal pad 53A is an example of the first pad according to the present embodiment. The metal pad 53B is an example of the second pad according to the present embodiment. The metal pad 53A and the metal pad 53B are connected to each other via a film resistor 55a. The width (here, the largest dimension in the X axis direction) of the metal pad 53A and the width (here, the largest dimension in the X axis direction) of the metal pad 53B are equivalent to each other. The length (here, the largest dimension in the Y axis direction) of the metal pad 53A and the length (here, the largest dimension in the Y axis direction) of the metal pad 53B are equivalent to each other.

Figure 3:
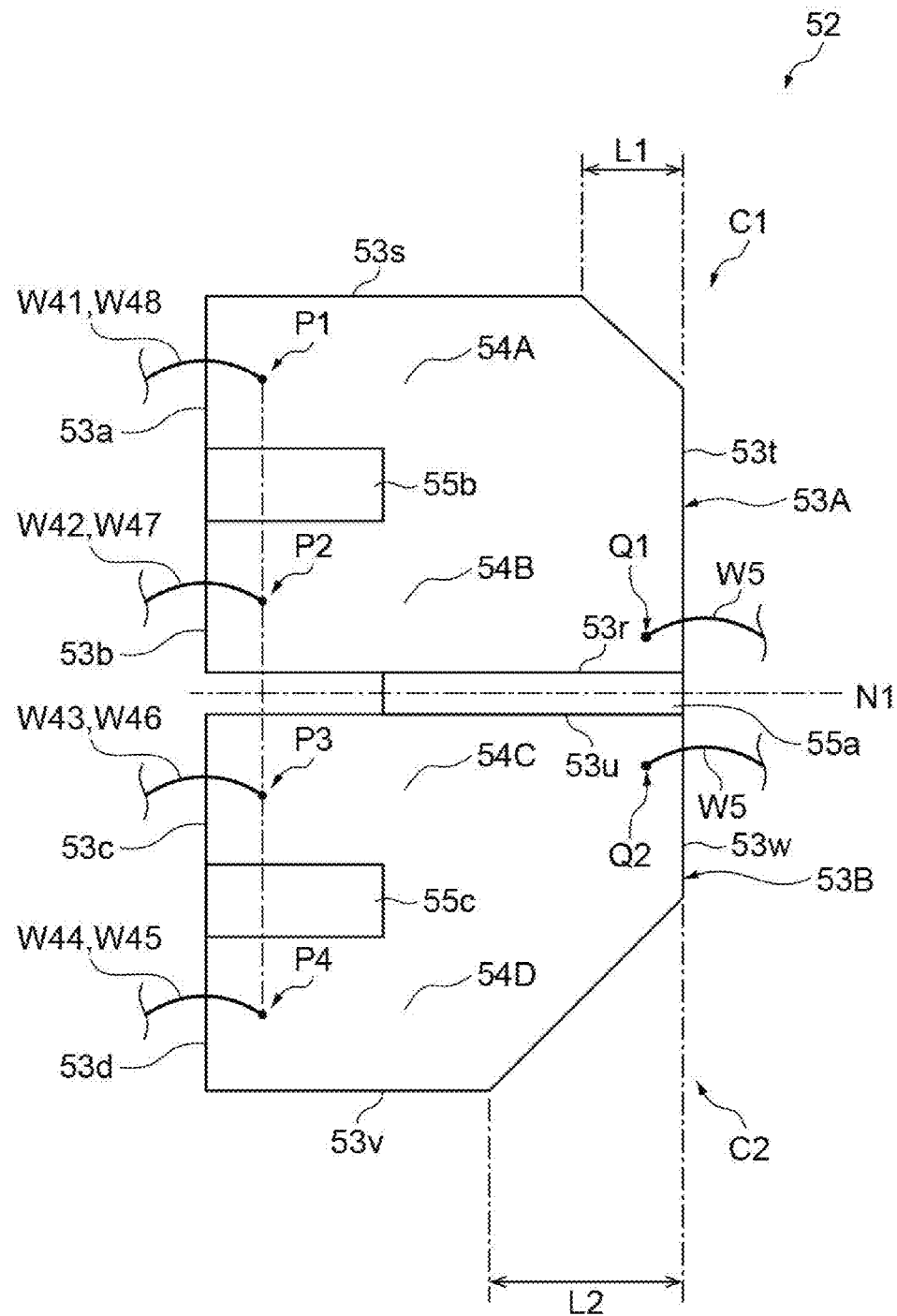
FIG. 3 is an enlarged plan view of one matching circuit pattern 52 in FIG. 2.

FIG. 3 is an enlarged plan view of one matching circuit pattern 52 in FIG. 2. An end portion of the metal pad 53A on one side in the Y axis direction branches into an input end 53a in the transmission line 54A and an input end 53b in the transmission line 54B. The transmission line 54A is connected to the bonding wire W41 or the bonding wire W48 at a connection point P1 (first connection point) in the input end 53a. The transmission line 54B is connected to the bonding wire W42 or the bonding wire W47 at a connection point P2 in the input end 53b. The input end 53a and the input end 53b are connected to each other via a film resistor 55b. The transmission line 54A and the transmission line 54B are coupled to a connection point Q1 at an end portion of the metal pad 53A on the other side in the Y axis direction and are connected to the bonding wire W5.

An end portion of the metal pad 53B on one side in the Y axis direction branches into an input end 53c in the transmission line 54C and an input end 53d in the transmission line 54D. The transmission line 54C is connected to the bonding wire W43 or the bonding wire W46 at a connection point P3 in the input end 53c. The transmission line 54D is connected to the bonding wire W44 or the bonding wire W45 at a connection point P4 (second connection point) in the input end 53d. The input end 53c and the input end 53d are connected to each other via a film resistor 55c. The transmission line 54C and the transmission line 54D are coupled to a connection point Q2 at an end portion of the metal pad 53B on the other side in the Y axis direction and are connected to the bonding wire W5.

The external shape of the metal pad 53A and the external shape of the metal pad 53B are asymmetrical with each other with respect to a virtual straight line N1 (second virtual straight line) which is orthogonal to a virtual straight line (first virtual straight line) connecting the connection point P1 and the connection point P4 to each other and passes through a median point between the connection point P1 and the connection point P4. In other words, the matching circuit pattern 52 has an asymmetrical external shape with respect to the virtual straight line N1. Due to such an external shape, the length of a part of the virtual straight line N1 on one side (here, a side including the connection point P1) at an outer edge of the matching circuit pattern 52 is longer than the length of a part of the virtual straight line N1 on the other side (here, a side including the connection point P4). Specifically, the length of a part of the virtual straight line N1 on one side is a length of a part having a position projected in the X axis direction from the connection point P1 as a starting point and a position projected in the Y axis direction from the connection point Q1 as an ending point at the outer edge of the matching circuit pattern 52 including the metal pad 53A. The length of a part of the virtual straight line N1 on the other side is a length of a part having a position projected in the X axis direction from the connection point P4 as a starting point and a position projected in the Y axis direction from the connection point Q2 as an ending point at the outer edge of the matching circuit pattern 52 including the metal pad 53B.

The metal pad 53A exhibits substantially a rectangular shape in a plan view and has four corner portions. The four corner portions include one chamfered corner portion C1 (first corner portion). In the four corner portions, three corner portions excluding the corner portion C1 are not chamfered. The metal pad 53A is connected to the metal pad 53B on a long side 53r on one side. The corner portion C1 is positioned at an intersection portion between a long side 53s on the other side in the metal pad 53A and a short side 53t facing the synthetic circuit board 30 (refer to FIG. 1). The transmission line 54A is constituted of a part including the corner portion C1 in the metal pad 53A. The transmission line 54B is constituted of a part not including the corner portion C1 in the metal pad 53A.

The metal pad 53B exhibits substantially a rectangular shape in a plan view and has four corner portions. The four corner portions include one chamfered corner portion C2 (second corner portion). The corner portion C2 is chamfered by a chamfering amount L2 larger than a chamfering amount L1 of the corner portion C1. For example, the chamfering amount L2 is approximately three times the chamfering amount L1. In the four corner portions, three corner portions excluding the corner portion C2 are not chamfered. The metal pad 53B is connected to the metal pad 53A on a long side 53u on one side. The corner portion C2 is positioned at an intersection portion between a long side 53v on the other side in the metal pad 53B and a short side 53w facing the synthetic circuit board 30 (refer to FIG. 1). The transmission line 54C is constituted of a part not including the corner portion C2 in the metal pad 53B. The transmission line 54D is constituted of a part including the corner portion C2 in the metal pad 53B. Therefore, the length of a part constituting the transmission line 54D at an outer edge of the metal pad 53B is shorter than the length of a part constituting the transmission line 54A at an outer edge of the metal pad 53A.

Figure 4:
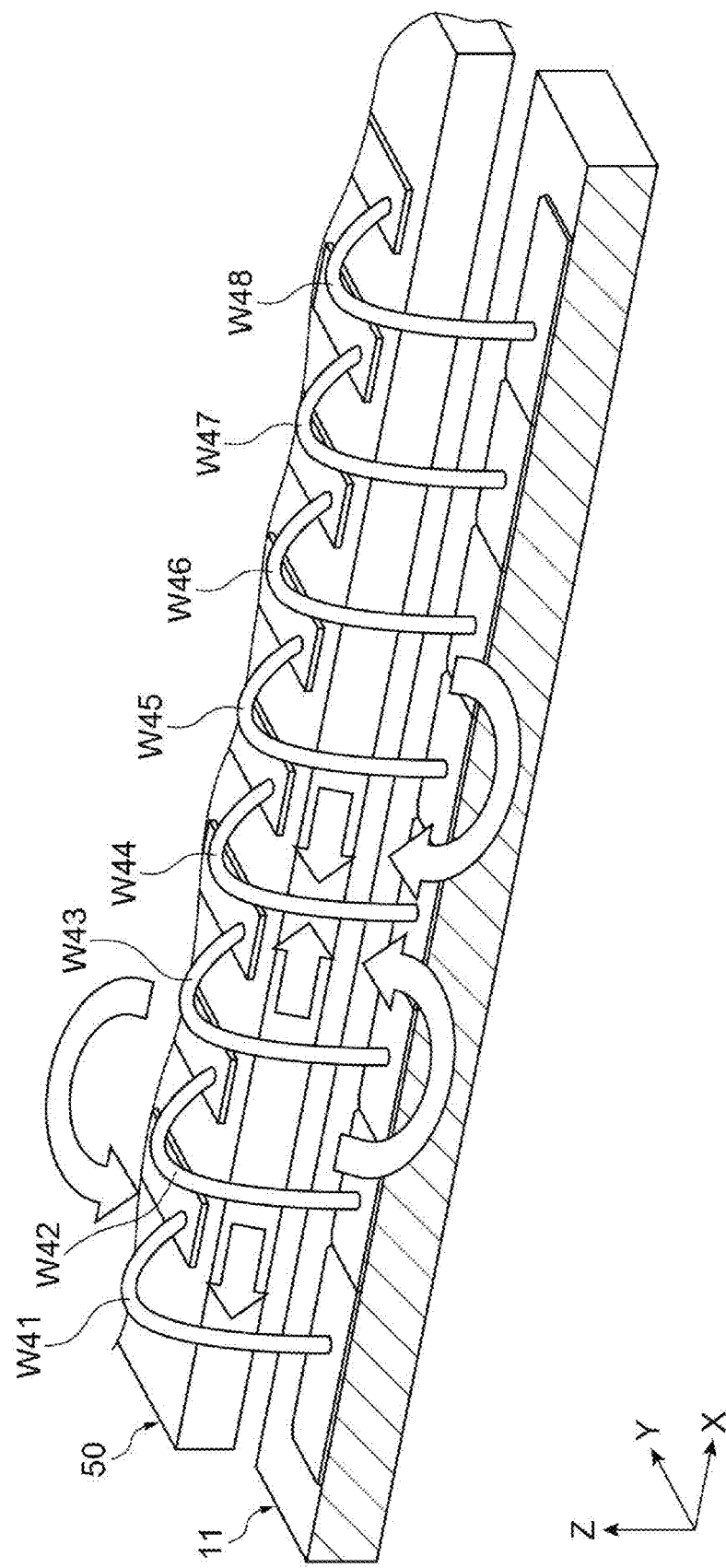
FIG. 4 is an explanatory perspective view of each electrical length of bonding wires W41, W42, W43, W44, W45, W46, W47, and W48.

Next, an electrical length in the constitution from the amplifier element 11 to the synthetic circuit 32 will be described. FIG. 4 is an explanatory perspective view of each electrical length from the bonding wire W41 to the bonding wire W48. As illustrated in FIG. 4, the bonding wire W41 mainly receives an influence of magnetic field coupling from the closest bonding wire W42 and an influence of magnetic field coupling from the second closest bonding wire W43. In contrast, the bonding wire W44 mainly receives influences of magnetic field coupling from each of the closest bonding wires W43 and W45 and magnetic field coupling from the second closest bonding wires W42 and W46. Accordingly, mutual inductance components of the bonding wire W41 increase in accordance with an influence from only one side, whereas mutual inductance components of the bonding wire W44 increase in accordance with influences from both sides. Namely, mutual inductance components of each of the bonding wire W41 to the bonding wire W48 increase in accordance with a different bonding wire W4 close thereto.

Figure 5:
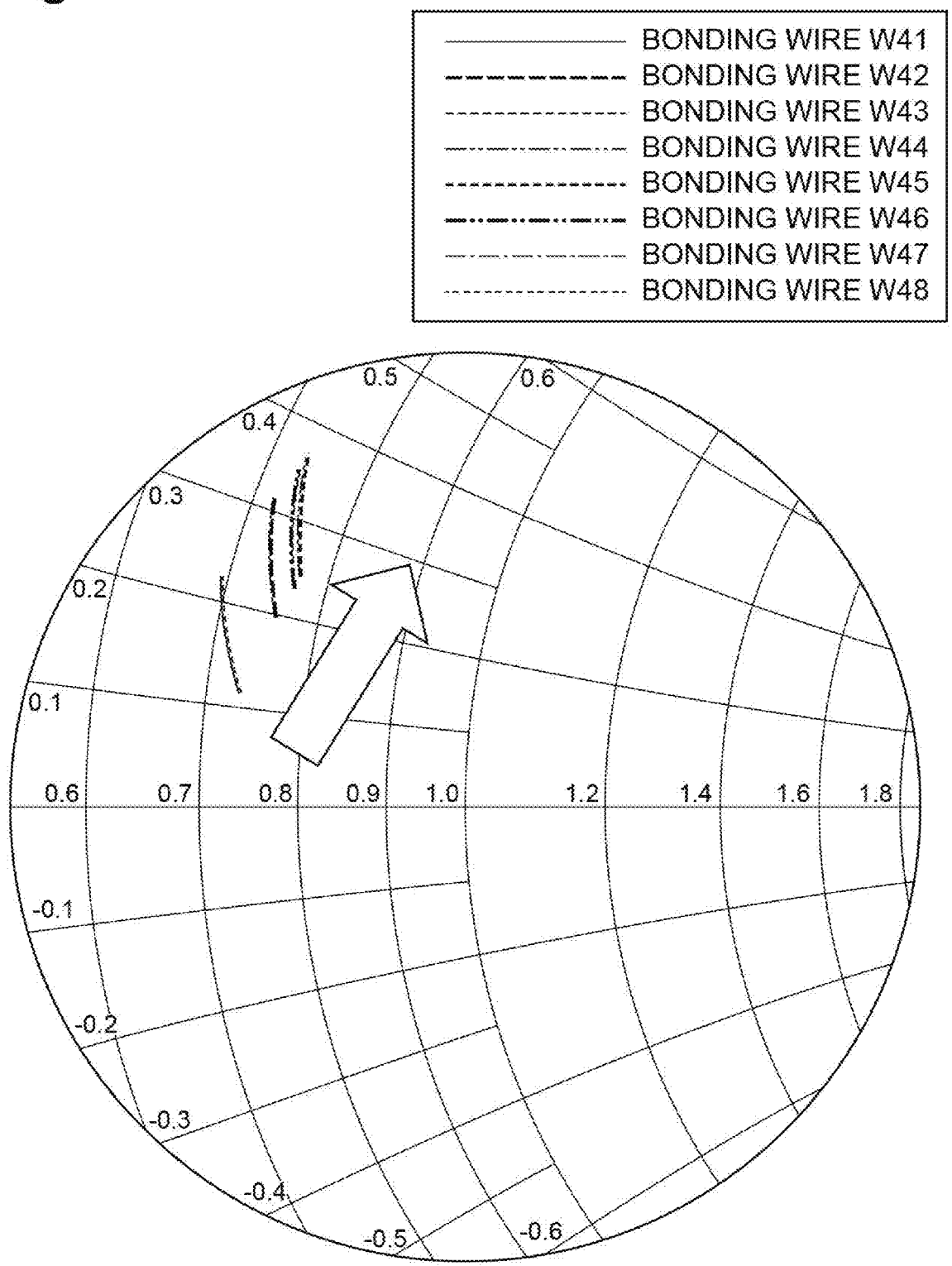
FIG. 5 is a Smith chart showing each impedance of the bonding wires W41, W42, W43, W44, W45, W46, W47, and W48.

FIG. 5 is a Smith chart showing each impedance of the bonding wire W41 to the bonding wire W48. FIG. 5 illustrates an S parameter (S11) for the transmission line terminal corresponding to the impedance of each of the bonding wire W41 to the bonding wire W48 within a frequency range of 10.700 GHz to 12.700 GHz. The impedance of each of the bonding wire W41 to the bonding wire W48 means an effective impedance of each of the bonding wire W41 to the bonding wire W48. The effective impedance means an impedance in one bonding wire W4 in consideration of an influence from a different bonding wire W4. In the Smith chart of FIG. 5, the range is displayed up to a reflection coefficient Γ=0.3, and the impedance 50Ω at the center of the Smith chart is standardized at the characteristic impedance $Z_0$=50Ω of the calculation port. Since the value of the inductance increases in the direction of the arrow in FIG. 5, it is ascertained from FIG. 5 that the inductances of the bonding wires W44 and W45 are larger than the bonding wires W41 and W48.

Figure 6:
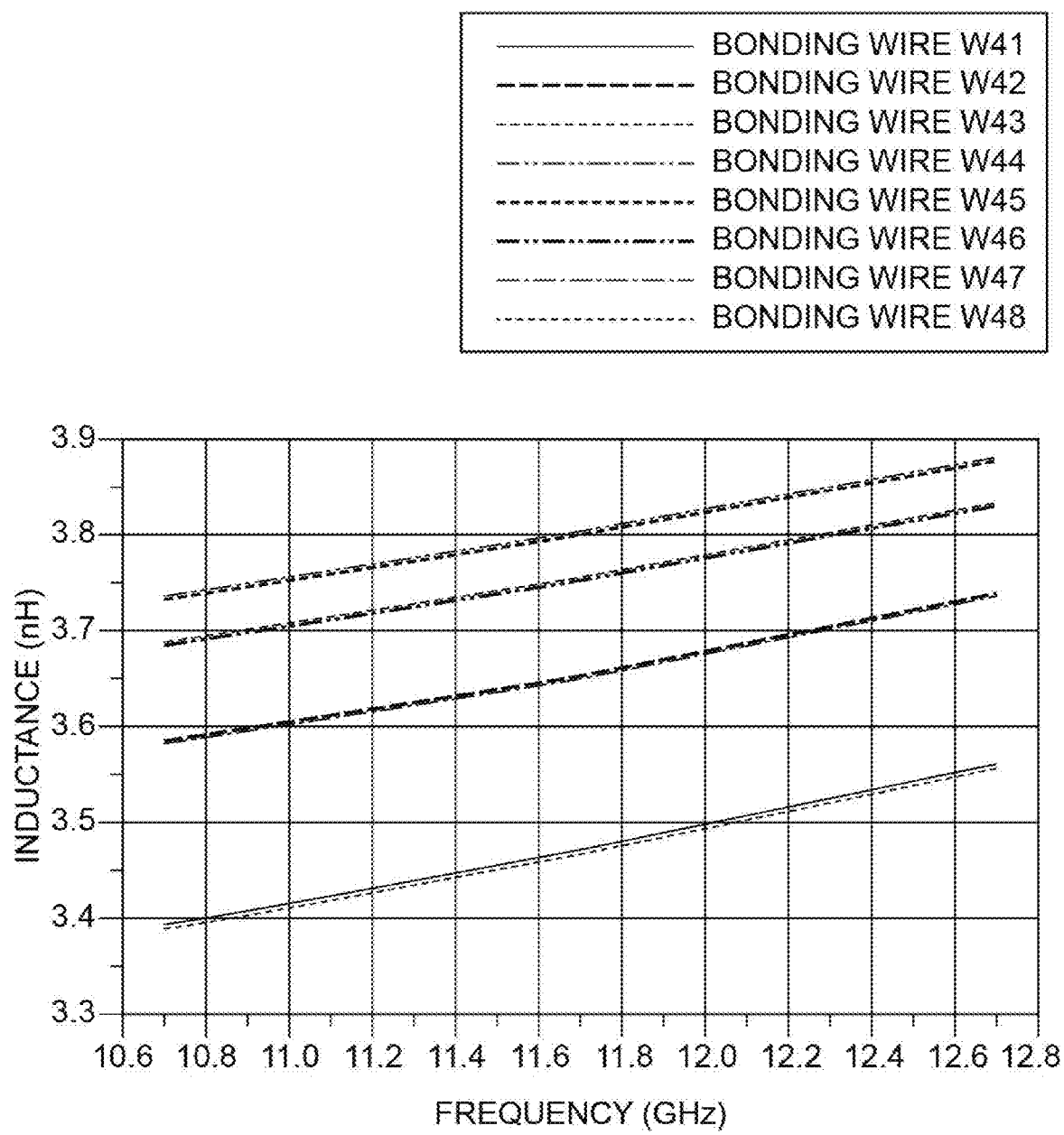
FIG. 6 is a graph showing an imaginary portion of each impedance of the bonding wires W41, W42, W43, W44, W45, W46, W47, and W48.

FIG. 6 is a graph showing each inductance of the bonding wire W41 to the bonding wire W48. In the graph of FIG. 6, the horizontal axis indicates a frequency, and the vertical axis indicates a value of the inductance. It is also ascertained from FIG. 6 that the inductances of the bonding wires W44 and W45 are larger than the inductances of the bonding wires W41 and W48. In this manner, in the plurality of bonding wires W4 arranged side by side in a row, the inductance increases toward the center of the row, and the inductance decreases toward the end of the row. Therefore, the effective electrical lengths of the bonding wire W41 to the bonding wire W48 become longer in the wire closer to the center of the row and become shorter in the wire closer to the end of the row. Specifically, the effective electrical length of the bonding wire W44 is longer than the effective electrical length of the bonding wire W41. The effective electrical length means an electrical length of a predetermined path through which electromagnetic waves pass and an electrical length in consideration of an influence of mutual inductances from a bonding wire W4 different of the bonding wire W4 included in the path.

Next, the electrical lengths of the transmission lines 54A and 54D will be described. Since a radio frequency signal is propagated through the transmission lines 54A and 54D as an electromagnetic wave, the electrical lengths of the transmission lines 54A and 54D correspond to the length of the path through which electromagnetic waves pass in the transmission lines 54A and 54D.

Figure 7:
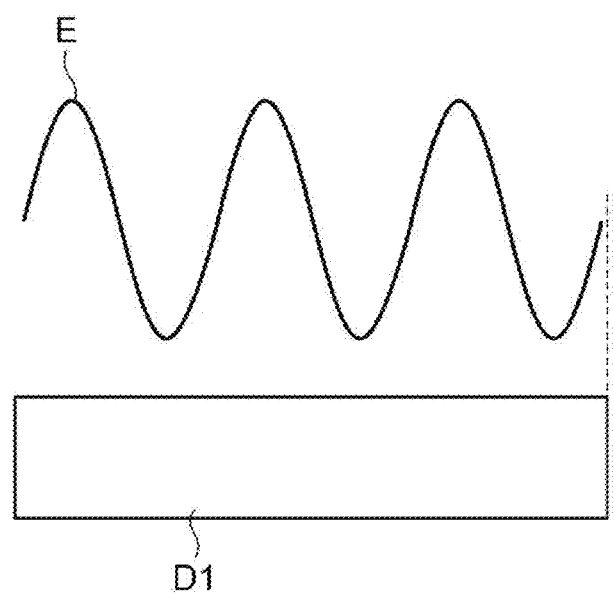
FIG. 7 is an explanatory view of a relationship between a length of a physical path through which electromagnetic waves pass and a phase.
Figure 8:
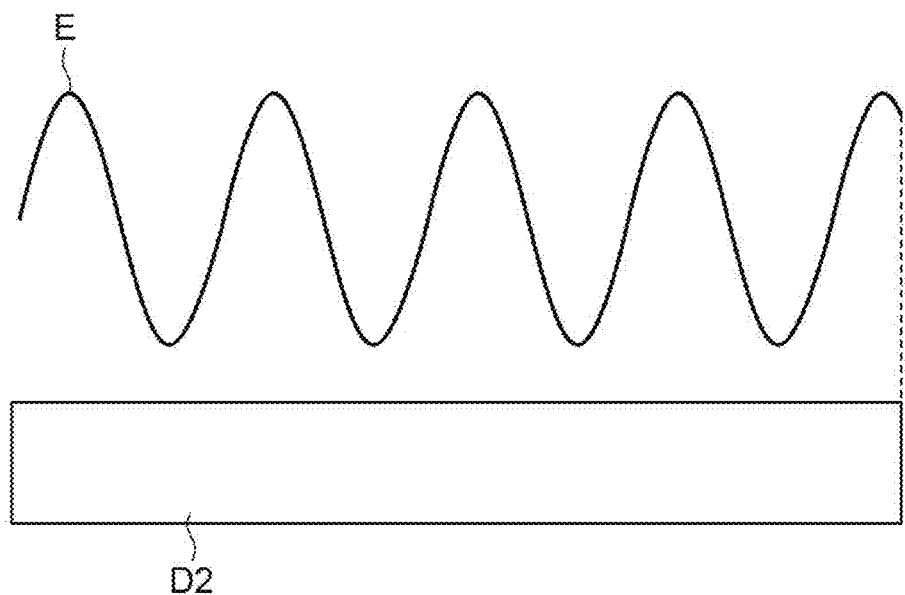
FIG. 8 is an explanatory view of a relationship between a length of a physical path through which electromagnetic waves pass and a phase.

First, with reference to FIGS. 7 and 8, a relationship between a length of a physical path through which electromagnetic waves pass and a phase will be described. FIGS. 7 and 8 are explanatory views of a relationship between a length of a physical path through which electromagnetic waves pass and a phase. FIG. 7 illustrates a path D1 through which an electromagnetic wave E passes, and FIG. 8 illustrates a path D2 through which the electromagnetic wave E passes. The path D2 is longer than the path D1. In the examples of FIGS. 7 and 8, the length of the path D2 is approximately 1.4 times the length of the path D1. Accordingly, a phase difference occurs between the electromagnetic wave E which has passed through the path D1 and the electromagnetic wave E which has passed through the path D2. Here, the phase of the electromagnetic wave E at a terminal of the path D1 is 0 deg, whereas the phase of the electromagnetic wave E at a terminal of the path D2 is approximately 90 deg. Therefore, a phase difference of approximately 90 deg has occurred.

Here, a path through which a radio frequency (microwave) which is an electromagnetic wave passes will be specifically described. FIG. 9 is an explanatory view of a distribution state of currents in microwaves. (a) portion of FIG. 9 is a cross-sectional view illustrating a dielectric substrate 90 and a metal conductor 80 provided on the dielectric substrate 90, and (b) portion of FIG. 9 is a graph showing a magnitude of a current flowing in the Y axis direction through the metal conductor 80. For example, the metal conductor 80 is a microstrip conductor. In the graph shown in FIG. 9, the horizontal axis indicates a position in the X axis direction having the center of the metal conductor 80 in the X axis direction as zero, and the vertical axis indicates a current value I.

Figure 10:
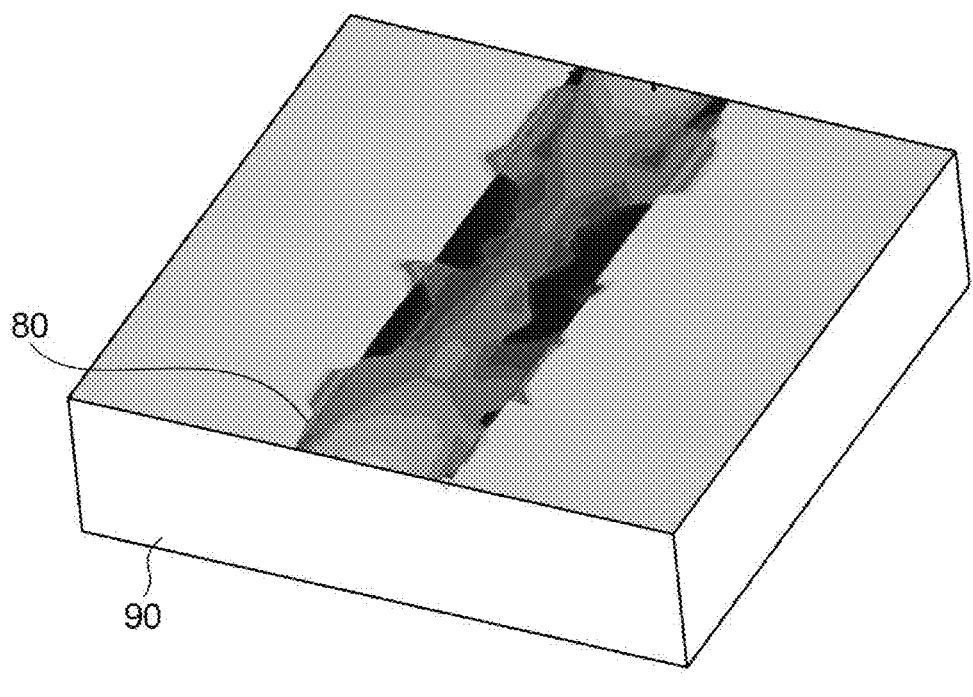
FIG. 10 is a view of a simulation illustrating a concentration state of currents in microwaves.

FIG. 10 is a view of a simulation illustrating a concentration state of currents in microwaves. FIG. 10 illustrates a state in which more currents are concentrated at a darker part. From FIG. 10, it is ascertained that currents are particularly in a concentrated state at both end portions of the metal conductor 80 in the X axis direction. Therefore, as illustrated in FIG. 9, regarding microwaves, when a current flows in the metal conductor 80, it is ascertained that the current value I increases at both end portions of the metal conductor 80 in the X axis direction.

FIG. 11 is a view of a simulation illustrating a distribution state of electric field intensities in microwaves. FIG. 11 illustrates that the electric field intensity increases at a darker part. From FIG. 11, it is ascertained that the electric field intensity particularly increases at both end portions of the metal conductor 80 in the X axis direction. Therefore, it is ascertained that microwaves which are electromagnetic waves mainly pass through an outer edge of a pattern such as the foregoing metal conductor 80. In other words, a physical path through which electromagnetic waves pass corresponds to an outer edge of a pattern. Therefore, the length of the physical path through which electromagnetic waves pass changes by changing the length of the outer edge of the pattern. The length of the outer edge of the pattern can be changed by changing the shape of the outer edge.

Figure 12:
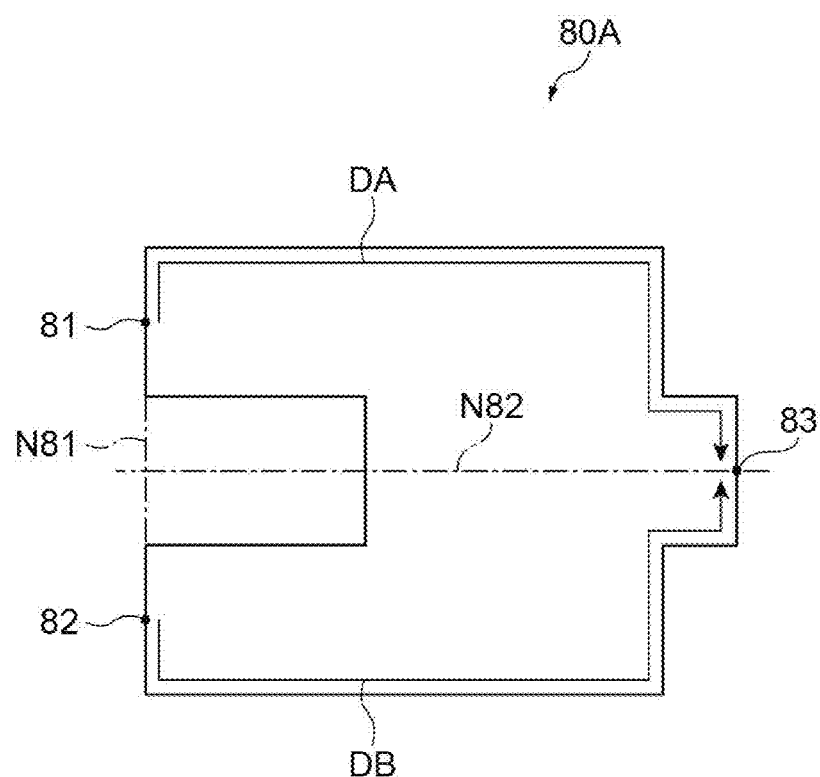
FIG. 12 is a plan view illustrating one reference example of a pattern 80A through which electromagnetic waves pass.
Figure 13:
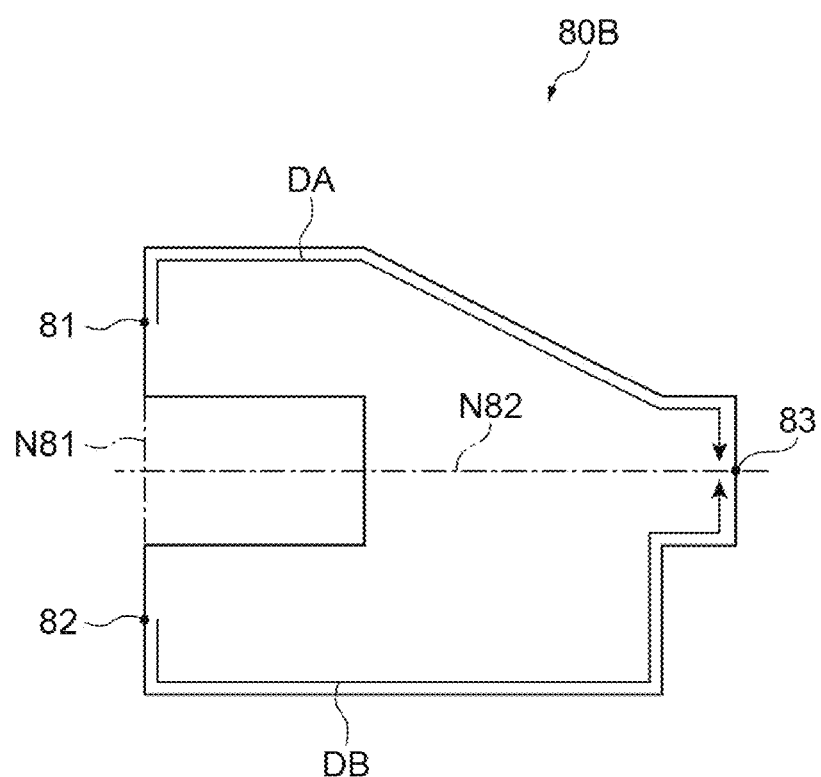
FIG. 13 is a plan view illustrating another reference example of a pattern 80B through which electromagnetic waves pass.

FIG. 12 is a plan view illustrating one reference example of a pattern 80A through which electromagnetic waves pass, and FIG. 13 is a plan view illustrating another reference example of a pattern 80B through which electromagnetic waves pass. Both the patterns 80A and 80B have two parallel input ports 81 and 82 and one output port 83. Each of the patterns 80A and 80B exhibits substantially a rectangular shape and is bifurcated into a part constituting the input port 81 and a part constituting the input port 82 at one end portion in the longitudinal direction. The output port 83 is positioned at the other end portion in the longitudinal direction of the patterns 80A and 80B. The distance from the input port 81 to the output port 83 and the distance from the input port 82 to the output port 83 are equivalent to each other.

Here, the external shape of the pattern 80A is line-symmetrical with respect to a virtual straight line N82 which is orthogonal to a virtual straight line N81 connecting the input ports 81 and 82 to each other and passes through a median point between the input ports 81 and 82. In contrast, the external shape of the pattern 80B is asymmetrical with respect to the virtual straight line N82. In the examples of FIGS. 12 and 13, all four corner portions in the pattern 80A form right angles, whereas four corner portions in the pattern 80B include three corner portions forming right angles and one chamfered corner portion. Specifically, the external shape of the pattern 80B exhibits a shape in which a corner portion forming a right angle is cut in a portion of a part from the input port 81 to the output port 83. For this reason, at an outer edge of the pattern 80B, the length from the input port 81 to the output port 83 is shorter than the length from the input port 82 to the output port 83.

As described above, since microwaves which are electromagnetic waves mainly pass through the outer edges of the patterns 80A and 80B, a path DA from the input port 82 to the output port 83 is shortcut with respect to a path DB from the input port 81 to the output port 83. In this manner, when a physical length difference occurs between the paths DA and DB, as described above, a phase difference occurs between an electromagnetic wave which has passed through the path DA and an electromagnetic wave which has passed through the path DB.

Figure 14:
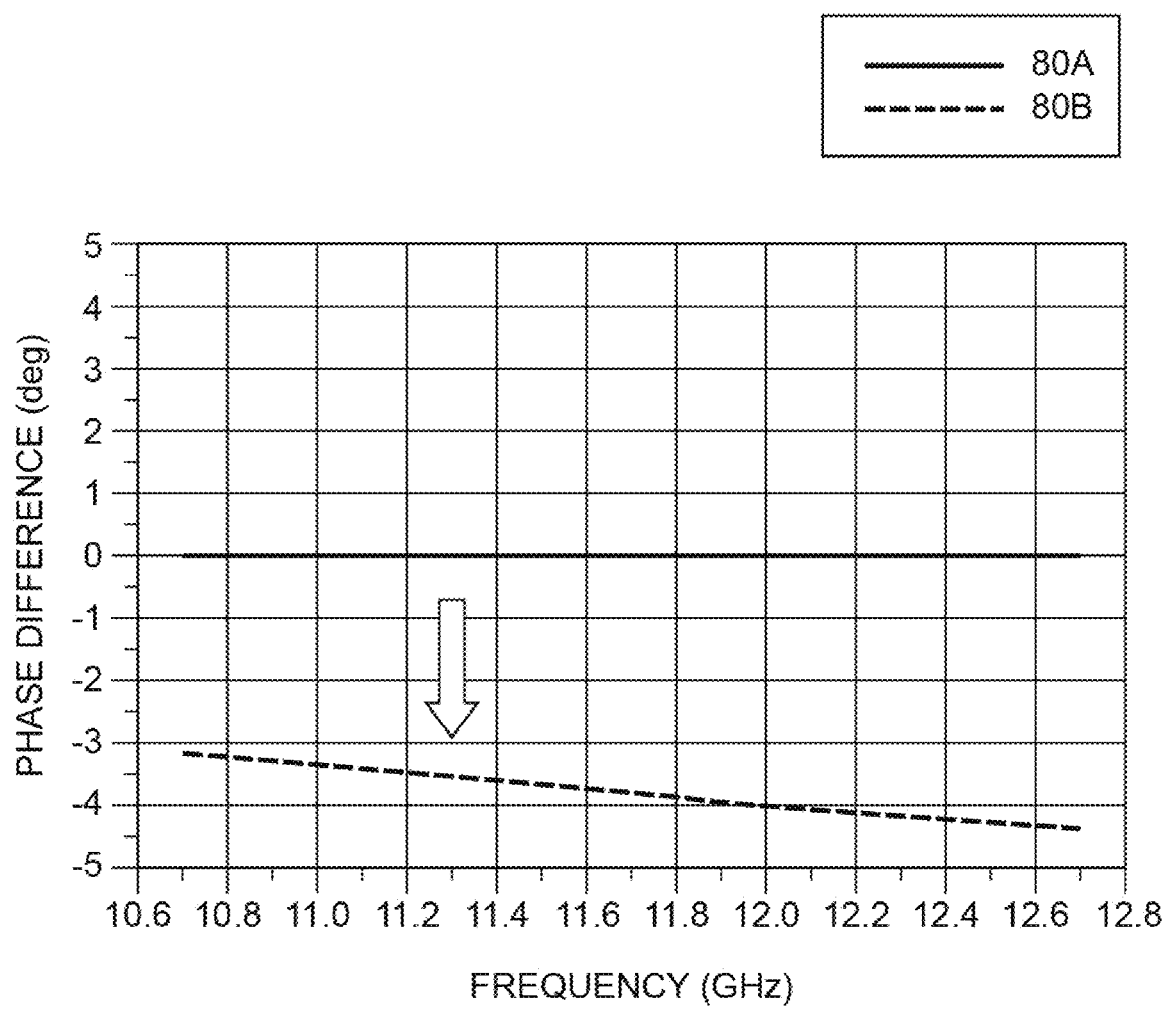
FIG. 14 is a graph showing a phase difference occurring between two electromagnetic waves which have respectively passed through paths DA and DB in the patterns 80A and 80B.

FIG. 14 is a graph showing a phase difference occurring between two electromagnetic waves which have respectively passed through the paths DA and DB in the patterns 80A and 80B. In the graph of FIG. 14, the horizontal axis indicates the frequency, and the vertical axis indicates the phase difference. From FIG. 14, it is ascertained that no phase difference has occurred in the pattern 80A but a phase difference has occurred in the pattern 80B. In FIG. 14, since the absolute value of the phase difference occurring in the pattern 80B becomes large as the frequency increases, it is ascertained that an influence on the phase difference occurring due to change in physical length of the paths DA and DB becomes significant as the frequency increases.

With reference to FIG. 3 again based on those above, the electrical lengths of the transmission lines 54A and 54D according to the present embodiment will be described. As described above, the length of a part constituting the transmission line 54D at the outer edge of the metal pad 53B is shorter than the length of a part constituting the transmission line 54A at the outer edge of the metal pad 53A. Therefore, the electrical length of the transmission line 54D is shorter than the electrical length of the transmission line 54A.

In the present embodiment, for example, the absolute value of the electrical length difference between the transmission lines 54A and 54D is substantially equivalent to the absolute value of the electrical length difference between the bonding wires W41 and W44 described above. In this specification, the expression "substantially equivalent" means that a difference between two values is small enough such that it can be disregarded. Accordingly, the total electrical length of the effective electrical length of the bonding wire W41 and the electrical length of the transmission line 54A has become substantially equivalent to the total electrical length of the effective electrical length of the bonding wire W44 and the electrical length of the transmission line 54D. In other words, the effective electrical length from the drain pad 15A to the wiring pattern 33 is substantially equivalent to the effective electrical length from the drain pad 15D to the wiring pattern 33. In the present embodiment, the effective electrical length difference occurring between the bonding wires W41 and W44 and the electrical length difference occurring between the transmission lines 54A and 54D are mutually offset. Accordingly, no phase difference occurs between an electromagnetic wave which has passed through the path from the drain pad 15A to the wiring pattern 33 and an electromagnetic wave which has passed through the path from the drain pad 15D to the wiring pattern 33.

Advantageous effects of the foregoing high frequency amplifier 1A will be described. In this high frequency amplifier 1A, each of the plurality of transistors 13 is connected to the matching circuit pattern 52 through the bonding wire W4. In this constitution, variation may occur in the effective impedance between the plurality of bonding wires W4 in accordance with the degree of an influence received from a different bonding wire W4. Such variation in effective impedance between the plurality of bonding wires W4 is manifested as variation in effective electrical length between the plurality of bonding wires W4. Specifically, the effective electrical length of the bonding wire W44 is longer than the effective electrical length of the bonding wire W41. Here, in this high frequency amplifier 1A, since the matching circuit pattern 52 has an asymmetrical external shape, the electrical length of the transmission line 54D is shorter than the electrical length of the transmission line 54A. Accordingly, in a constitution in which the effective electrical length of the bonding wire W44 is longer than the effective electrical length of the bonding wire W41, the electrical length difference between the bonding wires W41 and W44 may be canceled out by the electrical length difference between the transmission lines 54A and 54D. Therefore, variation between the effective electrical length from the transistor 13A (more specifically, the drain pad 15A) to the wiring pattern 33 and the effective electrical length from the transistor 13D (more specifically, the drain pad 15D) to the wiring pattern 33 is reduced. Since variation in effective impedance between the plurality of bonding wires W4 is reduced when variation in electrical length between the plurality of bonding wires W4 is reduced, variation in phase between the transistors 13A and 13D can be reduced due to this constitution. The same also applies to that between the transistors 13E and 13H.

In the foregoing high frequency amplifier 1A, the matching circuit pattern 52 has the metal pad 53A including the corner portion C1 and the metal pad 53B including the corner portion C2. The transmission line 54A is constituted of a part including the corner portion C1 in the metal pad 53A. The transmission line 54D is constituted of a part including the corner portion C2 in the metal pad 53B. The corner portion C2 is chamfered by the chamfering amount L2 larger than the chamfering amount L1 of the corner portion C1. According to knowledge of the inventors, as described above, currents (electric field) in a radio frequency is likely to be concentrated at an outer edge of a conductor. For this reason, in the transmission line 54A, a radio frequency signal is propagated along the corner portion C1 in the metal pad 53A. In the transmission line 54D, a radio frequency signal is propagated along the corner portion C2 in the metal pad 53B. Here, since the corner portion C2 is chamfered by the chamfering amount L2 larger than the chamfering amount L1 of the corner portion C1, the path including the corner portion C2 becomes shorter than the path including the corner portion C1, and thus a constitution in which the electrical length of the transmission line 54D is shorter than the electrical length of the transmission line 54A may be realized. According to this constitution, the effective electrical length from the transistor 13A to the wiring pattern 33 and the effective electrical length from the transistor 13D to the wiring pattern 33 are likely to be subjected to matching through adjustment of the chamfering amounts L1 and L2. Therefore, variation in phase between the transistors 13A and 13D can be more reliably reduced. The same also applies to that between the transistors 13E and 13H.

In the foregoing high frequency amplifier 1A, a plurality of transistor groups configured to include the transistor 13A, the transistor 13D, and the transistors 13E, 13F, 13G, and 13H are provided. Due to this constitution, the high frequency amplifier 1A having a high output can be realized.

In the foregoing high frequency amplifier 1A, the bonding wire W41 is disposed at the outermost part of the transistor groups, and the bonding wire W44 is disposed between the bonding wire W41 and the bonding wires W45, W46, W47, and W48. The length of the bonding wire W41 is equivalent to the length of the bonding wire W44, and the effective electrical length from the drain pad 15A to the wiring pattern 33 is substantially equivalent to the effective electrical length from the drain pad 15D to the wiring pattern 33. Therefore, the phases substantially coincide with each other between the transistors 13A and 13D. The same also applies to that between the transistors 13E and 13H. Hence, this is particularly advantageous from the viewpoint of improving the electric power efficiency of the high frequency amplifier 1A.

Next, the high frequency amplifier 1B according to the second embodiment will be described. As described above, FIG. 1 is a plan view illustrating an internal constitution of the high frequency amplifier 1A according to the first embodiment and the high frequency amplifier 1B according to the second embodiment. The high frequency amplifier 1B differs from the high frequency amplifier 1A in including a matching circuit 60 in place of the matching circuit 50 and is otherwise the same as the high frequency amplifier 1A in constitution. In the present embodiment, the high frequency amplifier 1B includes two matching circuits 60 as an example. Hereinafter, points differing from the high frequency amplifier 1A will be described.

Figure 15:
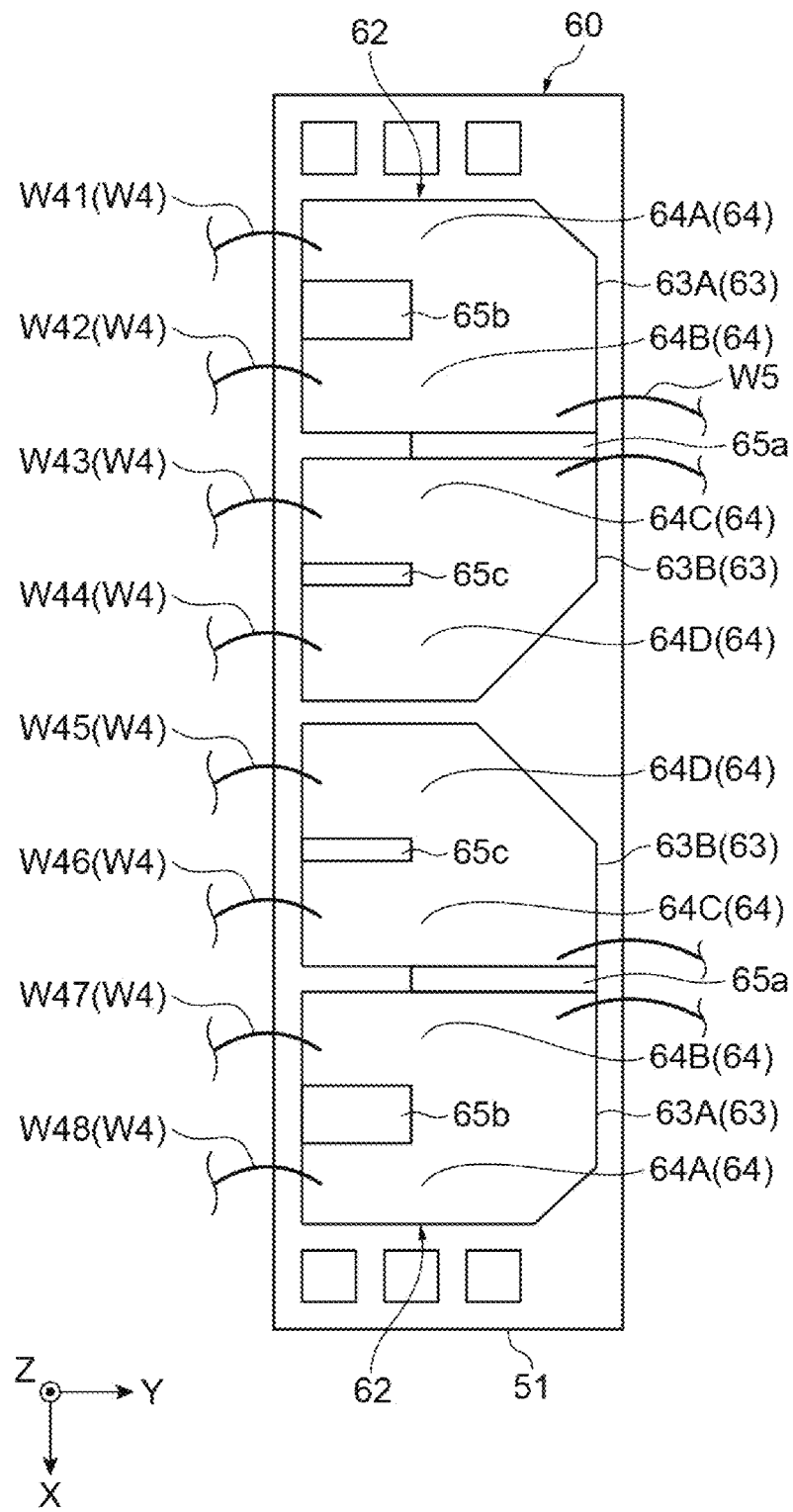
FIG. 15 is a plan view illustrating a matching circuit 60.

FIG. 15 is a plan view illustrating the matching circuit 60. The matching circuit 60 differs from the matching circuit 50 in including two matching circuit patterns 62 in place of two matching circuit patterns 52 and is otherwise the same as the matching circuit 50 in constitution. Each of the matching circuit patterns 62 has a plurality of metal pads 63. Similar to the metal pads 53, each of the metal pads 63 is electrically connected to the corresponding drain pad 15 of the amplifier element portion 10 via the bonding wire W4 and is electrically connected to the corresponding metal pad 33a of the synthetic circuit board 30 via the bonding wire W5.

The matching circuit pattern 62 has a plurality of transmission lines 64. In the two matching circuit patterns 62, the number of a plurality of transmission lines 64 is the same as the number of transistors 13 (refer to FIG. 2). One matching circuit pattern 62 has four transmission lines 64. The four transmission lines 64 include transmission lines 64A, 64B, 64C, and 64D.

The two matching circuit patterns 62 have mutually inverted constitutions with respect to the X axis direction. In the matching circuit pattern 62 on one side, the transmission lines 64A, 64B, 64C, and 64D corresponding to the transistors 13A, 13B, 13C, and 13D (refer to FIG. 2) are arranged side by side in this order in the X axis direction. The transmission line 64A in the matching circuit pattern 62 on one side is an example of the first transmission line according to the present embodiment. The transmission line 64D in the matching circuit pattern 62 on one side is an example of the second transmission line according to the present embodiment. The transmission lines 64B and 64C in the matching circuit pattern 62 on one side may be examples of the second transmission line according to the present embodiment. In the matching circuit pattern 62 on the other side, the transmission lines 64D, 64C, 64B, and 64A corresponding to the transistors 13E, 13F, 13G, and 13H are arranged side by side in this order in the X axis direction. The transmission lines 64D, 64C, 64B, and 64A in the matching circuit pattern 62 on the other side are examples of the third transmission line according to the present embodiment. In eight transmission lines 64, each of the two transmission lines 64A is disposed at the outermost part in the X axis direction. Each of the transmission lines 64B, 64C, and 64D is disposed between the two transmission lines 64A.

The transmission lines 64A and 64B are constituted of a metal pad 63A which is the metal pad 63 described above. The transmission lines 64C and 64D are constituted of a metal pad 63B which is the metal pad 63. The metal pad 63A is an example of the first pad according to the present embodiment. The metal pad 63B is an example of the second pad according to the present embodiment. The metal pad 63A and the metal pad 63B are connected to each other via a film resistor 65a. The width (here, the largest dimension in the X axis direction) of the metal pad 63A is smaller than the width (here, the largest dimension in the X axis direction) of the metal pad 63B. The length (here, the largest dimension in the Y axis direction) of the metal pad 63A and the length (here, the largest dimension in the Y axis direction) of the metal pad 63B are equivalent to each other.

Figure 16:
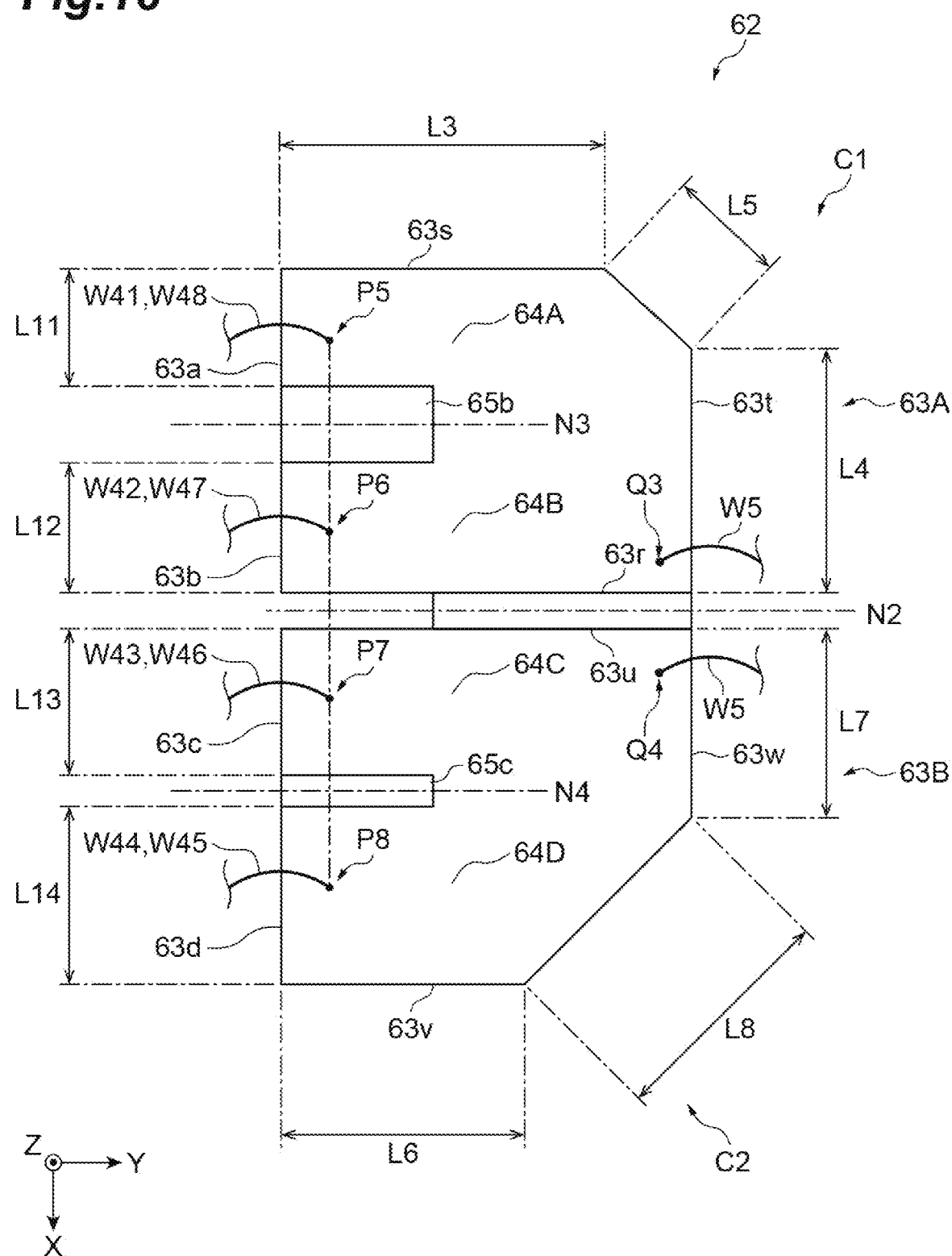
FIG. 16 is an enlarged plan view of one matching circuit pattern 62 in FIG. 15.

FIG. 16 is an enlarged plan view of one matching circuit pattern 62 in FIG. 15. An end portion of the metal pad 63A on one side in the Y axis direction branches into an input end 63a in the transmission line 64A and an input end 63b in the transmission line 64B. The transmission line 64A is connected to the bonding wire W41 or the bonding wire W48 at a connection point P5 (first connection point) in the input end 63a. The transmission line 64B is connected to the bonding wire W42 or the bonding wire W47 at a connection point P6 in the input end 63b. The input end 63a and the input end 63b are connected to each other via a film resistor 65b. The transmission line 64A and the transmission line 64B are coupled to a connection point Q3 at an end portion of the metal pad 63A on the other side in the Y axis direction and are connected to the bonding wire W5.

An end portion of the metal pad 63B on one side in the Y axis direction branches into an input end 63c in the transmission line 64C and an input end 63d in the transmission line 64D. The transmission line 64C is connected to the bonding wire W43 or the bonding wire W46 at a connection point P7 in the input end 63c. The transmission line 64D is connected to the bonding wire W44 or the bonding wire W45 at a connection point P8 (second connection point) in the input end 63d. The input end 63c and the input end 63d are connected to each other via a film resistor 65c. The transmission line 64C and the transmission line 64D are coupled to a connection point Q4 at an end portion of the metal pad 63B on the other side in the Y axis direction and are connected to the bonding wire W5.

The external shape of the metal pad 63A and the external shape of the metal pad 63B are asymmetrical with each other with respect to a virtual straight line N2 (second virtual straight line) which is orthogonal to a virtual straight line (first virtual straight line) connecting the connection point P5 and the connection point P8 to each other and passes through a median point between the connection point P5 and the connection point P8. In other words, the matching circuit pattern 62 has an asymmetrical external shape with respect to the virtual straight line N2. Due to such an external shape, at an outer edge of the matching circuit pattern 62, the length of a part of the virtual straight line N2 on one side (here, a side including the connection point P5) is longer than the length of a part of the virtual straight line N2 on the other side (here, a side including the connection point P8). Specifically, the length of a part of the virtual straight line N2 on one side is a length of a part having a position projected in the X axis direction from the connection point P5 as a starting point and a position projected in the Y axis direction from the connection point Q3 as an ending point at the outer edge of the matching circuit pattern 62 including the metal pad 63A. The length of a part of the virtual straight line N2 on the other side is a length of a part having a position projected in the X axis direction from the connection point P8 as a starting point and a position projected in the Y axis direction from the connection point Q4 as an ending point at the outer edge of the matching circuit pattern 62 including the metal pad 63B.

Similar to the metal pad 53A, the metal pad 63A exhibits substantially a rectangular shape in a plan view and has four corner portions including one corner portion C1 (first corner portion). The metal pad 63A is connected to the metal pad 63B on a long side 63r on one side. The corner portion C1 is positioned at an intersection portion between a long side 63s on the other side in the metal pad 63A and a short side 63t facing the synthetic circuit board 30 (refer to FIG. 1). The transmission line 64A is constituted of a part including the corner portion C1 in the metal pad 63A. The transmission line 64B is constituted of a part not including the corner portion C1 in the metal pad 63A.

Similar to the metal pad 53B, the metal pad 63B exhibits substantially a rectangular shape in a plan view and has four corner portions including one corner portion C2 (second corner portion). The metal pad 63B is connected to the metal pad 63A on one side on a long side 63u. The corner portion C2 is positioned at an intersection portion between a long side 63v on the other side in the metal pad 63B and a short side 63w facing the synthetic circuit board 30 (refer to FIG. 1). The transmission line 64C is constituted of a part not including the corner portion C2 in the metal pad 63B. The transmission line 64D is constituted of a part including the corner portion C2 in the metal pad 63B.

In the present embodiment, the length of a part constituting the transmission line 64D at an outer edge of the metal pad 63B is shorter than the length of a part constituting the transmission line 64A at an outer edge of the metal pad 63A. As an example, in the metal pad 63A, a length L3 of the long side 63s is approximately 485 µm, a length L4 of the short side 63t is approximately 325 µm, and a length L5 of a chamfered portion in the corner portion C1 is approximately 78 µm. The length of a part constituting the transmission line 64A at the outer edge of the metal pad 63A (that is, the total value of the lengths L3, L4, and L5) is approximately 888 µm herein. In the metal pad 63B, a length L6 of the long side 63v is approximately 360 µm, a length L7 of the short side 63w is approximately 255 µm, and a length L8 of a chamfered portion in the corner portion C2 is 255 µm. The length of a part constituting the transmission line 64D at the outer edge of the metal pad 63B (that is, the total value of the lengths L6, L7, and L8) is approximately 870 µm herein.

The metal pad 63A has an asymmetrical external shape with respect to a virtual straight line N3 (second virtual straight line) which is orthogonal to a virtual straight line (first virtual straight line) connecting the connection point P5 and the connection point P6 to each other and passes through a median point between the connection point P5 and the connection point P6. The metal pad 63B has an asymmetrical external shape with respect to a virtual straight line N4 (second virtual straight line) which is orthogonal to a virtual straight line (first virtual straight line) connecting the connection point P7 and the connection point P8 to each other and passes through a median point between the connection point P7 and the connection point P8. Specifically, a width L11 (here, the dimension in the X axis direction) of the input end 63a and a width L12 (here, the dimension in the X axis direction) of the input end 63b are different from each other, and a width L13 (here, the dimension in the X axis direction) of the input end 63c and a width L14 (here, the dimension in the X axis direction) of the input end 63d are different from each other. The width L11 is smaller than the width L12. That is, the transmission line 64A is thinner than the transmission line 64B. The width L13 is smaller than the width L14. That is, the transmission line 64C is thinner than the transmission line 64D.

In the present embodiment, the transmission lines 64A and 64B are thinner than the transmission lines 64C and 64D. The widths L11, L12, L13, and L14 are different from each other and are larger in this order. In other words, in a plurality of input ends arranged side by side in the X axis direction, an input end closer to the center of the dielectric substrate 51 in the X axis direction has a larger width (here, the dimension in the X axis direction). For example, the width L11 is approximately 0.6 times the width L14, the width L12 is approximately 0.85 times the width L14, and the width L13 is approximately 0.9 times the width L14. As an example, the width L11 is approximately 120 µm, the width L12 is approximately 170 µm, the width L13 is approximately 180 µm, and the width L14 is approximately 200 µm. In this example, in consideration of the thickness (specifically, 200 µm) of the dielectric substrate 51 described above and the relative dielectric constant (specifically, εr=150), when the frequency is 11.7 GHz, the effective wavelength in the transmission line 64A becomes 123.4 deg, and the effective wavelength in the transmission line 64D becomes 120.9 deg.

The electrical lengths of the transmission lines 64A and 64D will be described. As described above, the length of a part constituting the transmission line 64D at the outer edge of the metal pad 63B is shorter than the length of a part constituting the transmission line 64A at the outer edge of the metal pad 63A. Moreover, in the present embodiment, since the transmission line 64A is thinner than the transmission line 64D, the impedance of the transmission line 64A is larger than the impedance of the transmission line 64D. Therefore, the electrical length of the transmission line 64D is shorter than the electrical length of the transmission line 64A.

In the present embodiment, for example, the absolute value of the electrical length difference between the transmission lines 64A and 64D is equivalent to the absolute value of the effective electrical length difference between the bonding wires W41 and W44 described above. Accordingly, the total electrical length of the effective electrical length of the bonding wire W41 and the electrical length of the transmission line 64A has become substantially equivalent to the total electrical length of the effective electrical length of the bonding wire W44 and the electrical length of the transmission line 64D. In other words, the effective electrical length from the drain pad 15A to the wiring pattern 33 is substantially equivalent to the effective electrical length from the drain pad 15D to the wiring pattern 33. In the present embodiment, the effective electrical length difference occurring between the bonding wires W41 and W44 and the electrical length difference occurring between the transmission lines 64A and 64D are mutually offset. Accordingly, no phase difference occurs between an electromagnetic wave which has passed through the path from the drain pad 15A to the wiring pattern 33 and an electromagnetic wave which has passed through the path from the drain pad 15D to the wiring pattern 33.

Figure 19:
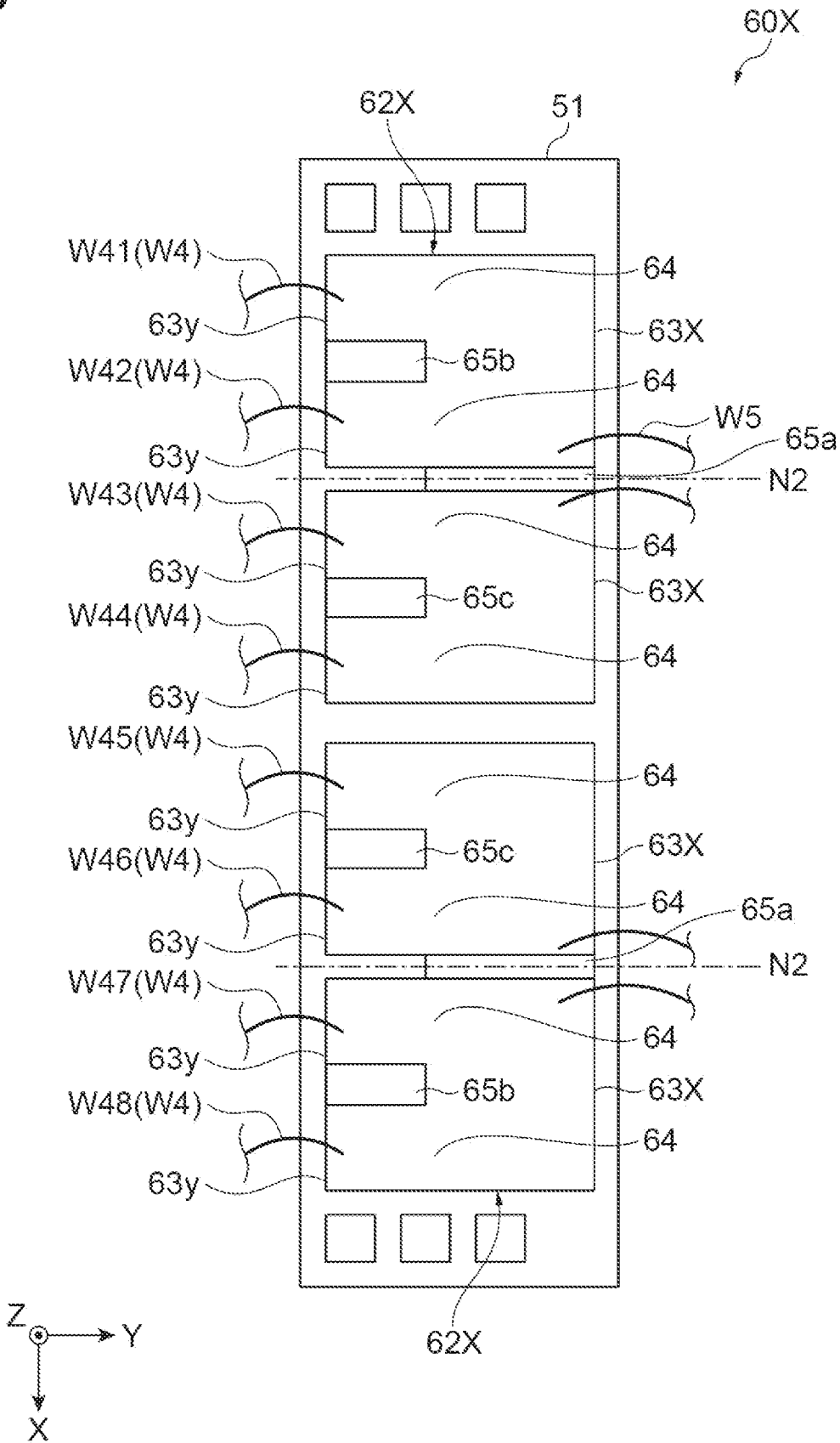
FIG. 19 is a plan view illustrating a matching circuit 60X of a high frequency amplifier according to a comparative example.

Advantageous effects of the foregoing high frequency amplifier 1B will be described. First, a comparative example will be described. A high frequency amplifier according to the comparative example differs from the high frequency amplifier 1B in including a matching circuit 60X according to the comparative example in place of the matching circuit 60. FIG. 19 is a plan view illustrating the matching circuit 60X of the high frequency amplifier according to the comparative example. The matching circuit 60X differs from the matching circuit 60 in including two matching circuit patterns 62X in place of the two matching circuit patterns 62 and is otherwise the same as the matching circuit 60 in constitution.

Each of the matching circuit patterns 62X has two metal pads 63X in place of the metal pads 63A and 63B. The metal pads 63X differ from the metal pads 63A and 63B in having no chamfered corner portions C1 and C2. In the metal pads 63X, all four corner portions are constituted to form right angles. Two metal pads 63X in the matching circuit patterns 62X differ from the metal pads 63A and 63B in having four input ends 63y in place of the input ends 63a, 63b, 63c, and 63d. The widths (here, the dimensions in the X axis direction) of the four input ends 63y are equivalent to each other. The metal pads 63X are otherwise the same as the metal pads 63A and 63B in constitution. Namely, the external shapes of the matching circuit patterns 62X according to the comparative example are line-symmetrical with respect to the virtual straight line N2.

Figure 20:
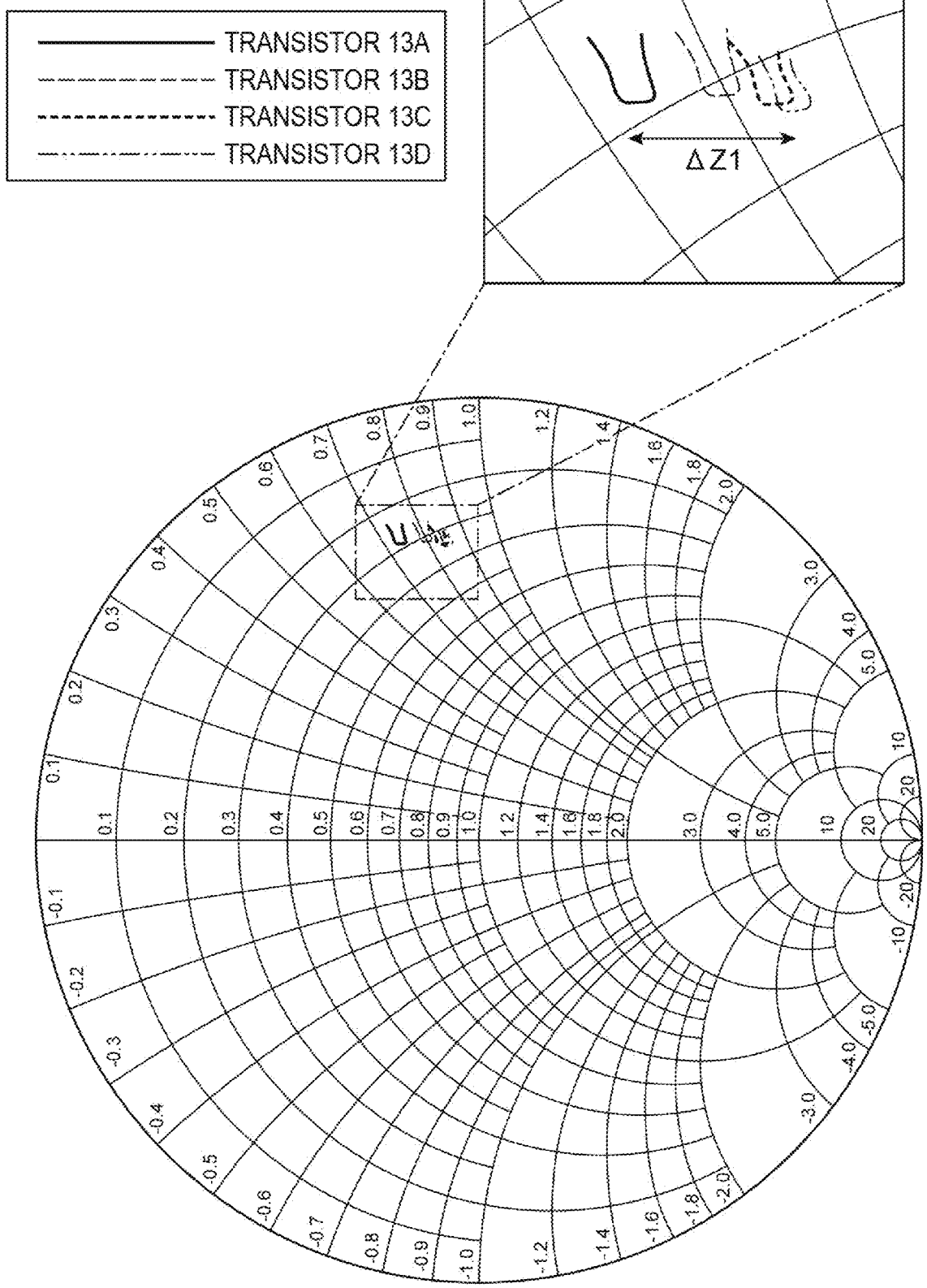
FIG. 20 is a Smith chart showing each load impedance in the transistors 13A, 13B, 13C, and 13D of the high frequency amplifier according to the comparative example.

FIG. 20 is a Smith chart showing each load impedance in the transistors 13A, 13B, 13C, and 13D of the high frequency amplifier according to the comparative example. In FIG. 20, each load impedance in the transistors 13A, 13B, 13C, and 13D is indicated within a frequency range of 10.700 GHz to 12.700 GHz. From FIG. 20, it is ascertained that a range of variation in phase occurring between the transistors 13A, 13B, 13C, and 13D (here, a phase difference ΔZ1 occurring between the transistors 13A and 13D) becomes large. In the example of FIG. 20, the phase difference ΔZ1 is approximately 9 deg.

It is considered that each load impedance in the transistors 13H, 13G, 13F, and 13E is approximately the same as each load impedance in the transistors 13A, 13B, 13C, and 13D. Hence, in the high frequency amplifier according to the comparative example, it is ascertained that significant variation has occurred in phase between the transistor 13A to the transistor 13H (in the example of FIG. 20, variation within a range of approximately 9 deg).

Figure 21:
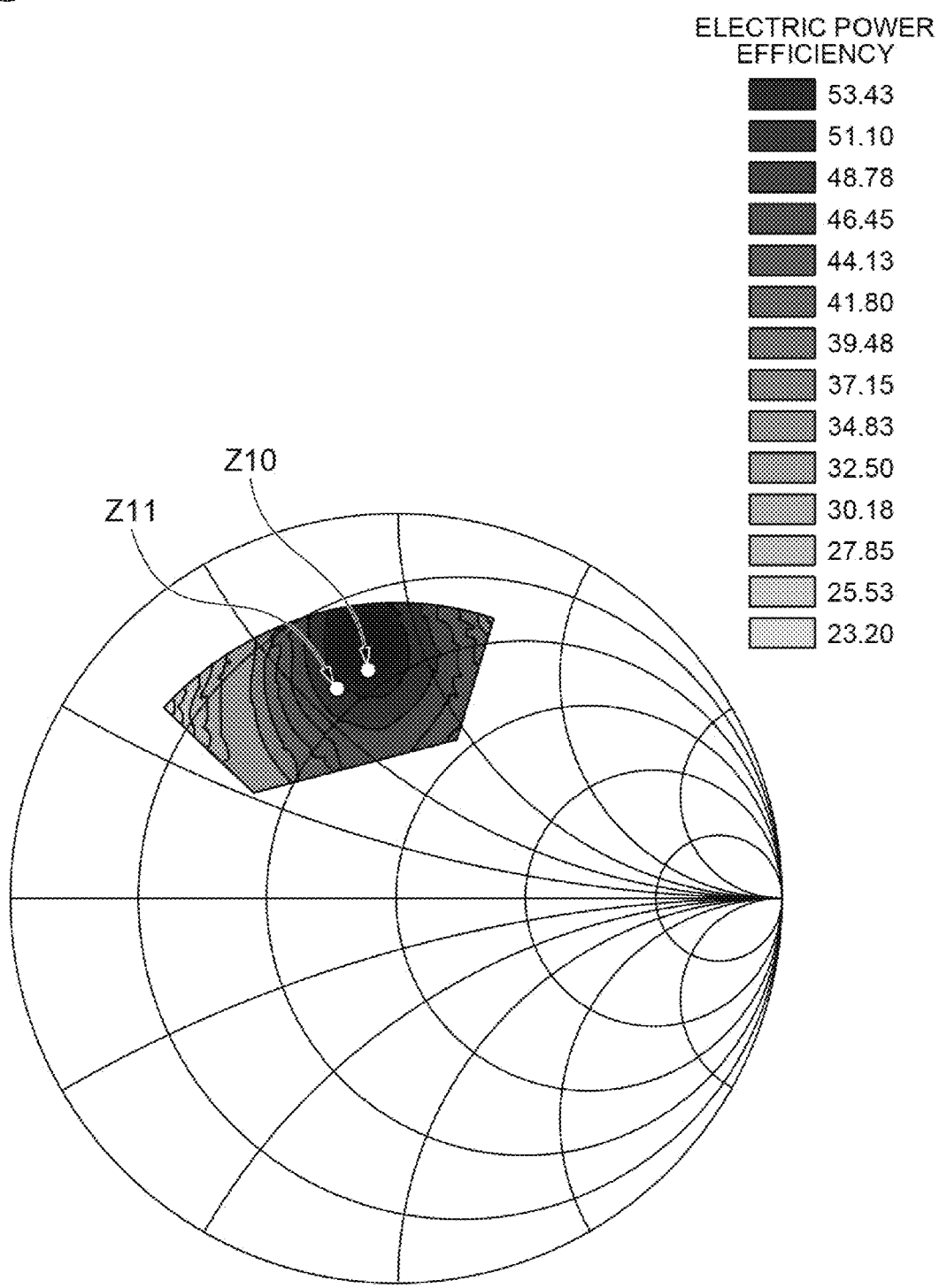
FIG. 21 is a view illustrating a relationship between variation in phase of a load impedance and electric power efficiency according to the comparative example.

FIG. 21 is a view illustrating a relationship between variation in phase of a load impedance and electric power efficiency according to the comparative example. The contour diagram of FIG. 21 illustrates that the electric power efficiency becomes higher at a darker part. The Smith chart of FIG. 21 illustrates a peak point Z10 of the phase of a load impedance in which the maximum electric power efficiency (here, ηd=52.9%) can be obtained at a frequency of 11.700 GHz. The peak point Z10 is 99 deg herein. From FIG. 21, at a point Z11 (here, 108 deg) of which the phase is shifted by approximately 9 deg with respect to the peak point Z10, it is ascertained that the electric power efficiency becomes lower (here, approximately ηd=50.0%) than that at the peak point Z10. Therefore, when the matching circuit 60X is used, it is ascertained that the electric power efficiency becomes lower than that at the peak point Z10 by approximately 3%.

In contrast, in the high frequency amplifier 1B according to the present embodiment, due to a constitution similar to that of the high frequency amplifier 1A described above, effects similar to those of the high frequency amplifier 1A can be achieved. Moreover, in the high frequency amplifier 1B, the transmission line 64A is thinner than the transmission line 64D. Accordingly, since the impedance per unit length of the transmission line 64A can become higher than the impedance per unit length of the transmission line 64D, a constitution in which the electrical length of the transmission line 64D is shorter than the electrical length of the transmission line 64A may be realized. According to the degree of thinning of the transmission line 64A, the effective electrical length from the transistor 13A to the wiring pattern 33 and the effective electrical length from the transistor 13D to the wiring pattern 33 are likely to be subjected to matching. Therefore, variation in phase between the transistor 13A and the transistor 13D can be more reliably reduced. Due to a similar reason, variation in phase between the transistor 13A to the transistor 13H can be more reliably reduced.

Figure 17:
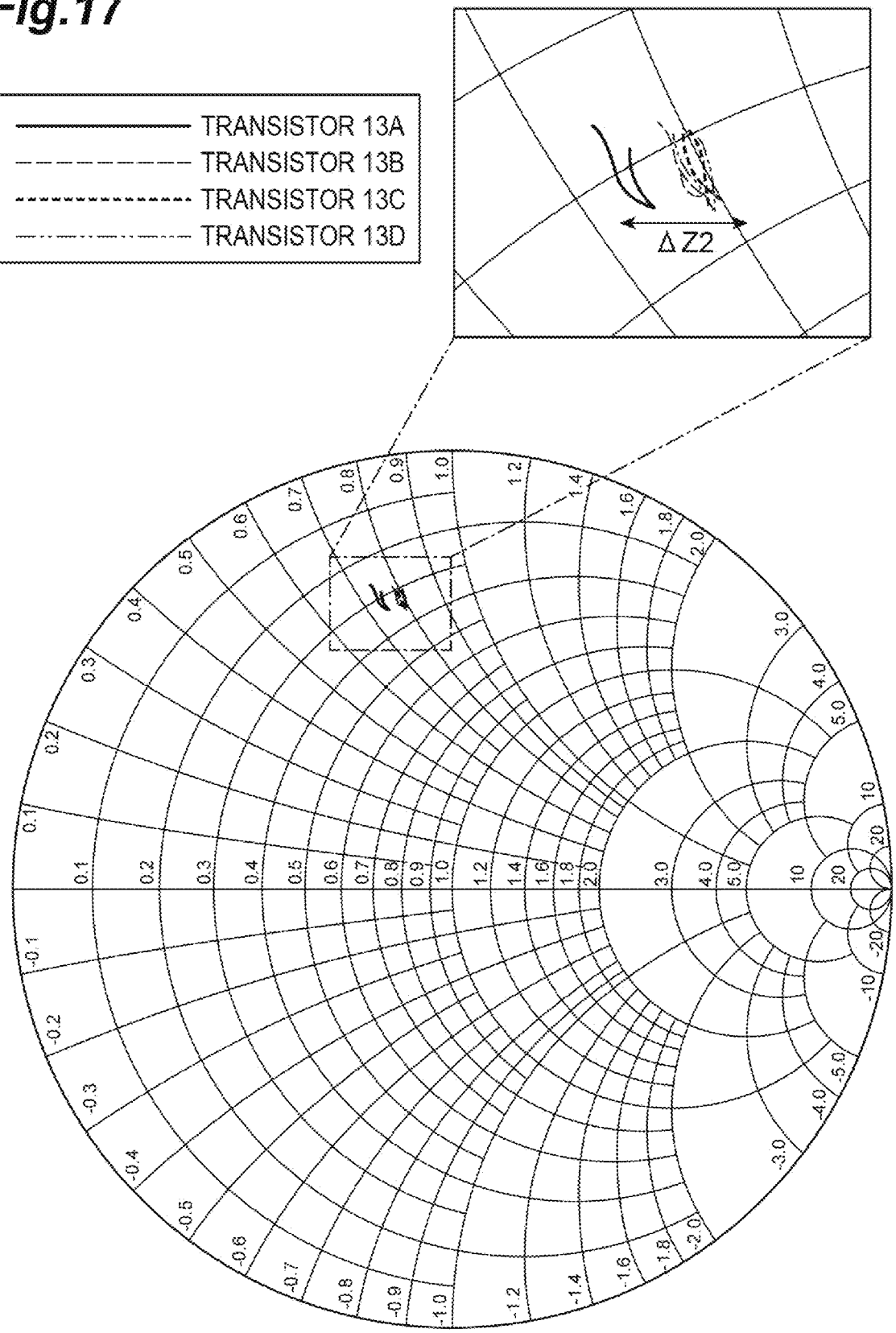
FIG. 17 is a Smith chart showing each load impedance in transistors 13A, 13B, 13C, and 13D of the high frequency amplifier 1B according to the second embodiment.

FIG. 17 is a Smith chart showing each load impedance in the transistors 13A, 13B, 13C, and 13D of the high frequency amplifier 1B according to the second embodiment. In FIG. 17, each load impedance in the transistors 13A, 13B, 13C, and 13D is indicated within a frequency range of 10.700 GHz to 12.700 GHz. From FIG. 17, it is ascertained that a range of variation in phase occurring between the transistors 13A, 13B, 13C, and 13D (here, a phase difference ΔZ2 occurring between the transistors 13A and 13D) is small. In the example of FIG. 17, the phase difference ΔZ2 is approximately 4 deg.

It is considered that each load impedance in the transistors 13H, 13G, 13F, and 13E is approximately the same as each load impedance in the transistors 13A, 13B, 13C, and 13D. Hence, according to the high frequency amplifier 1B, it is ascertained that only small variation has occurred in phase between the transistor 13A to the transistor 13H (in the example of FIG. 17, variation within a range of approximately 4 deg). For this reason, it is ascertained that variation in phase occurring between the transistor 13A to the transistor 13H can be further reduced in the high frequency amplifier 1B than in the high frequency amplifier according to the comparative example. In the example of FIG. 17, it is ascertained that the range of variation can be reduced than that in the example of FIG. 20 by approximately 5 deg.

Figure 18:
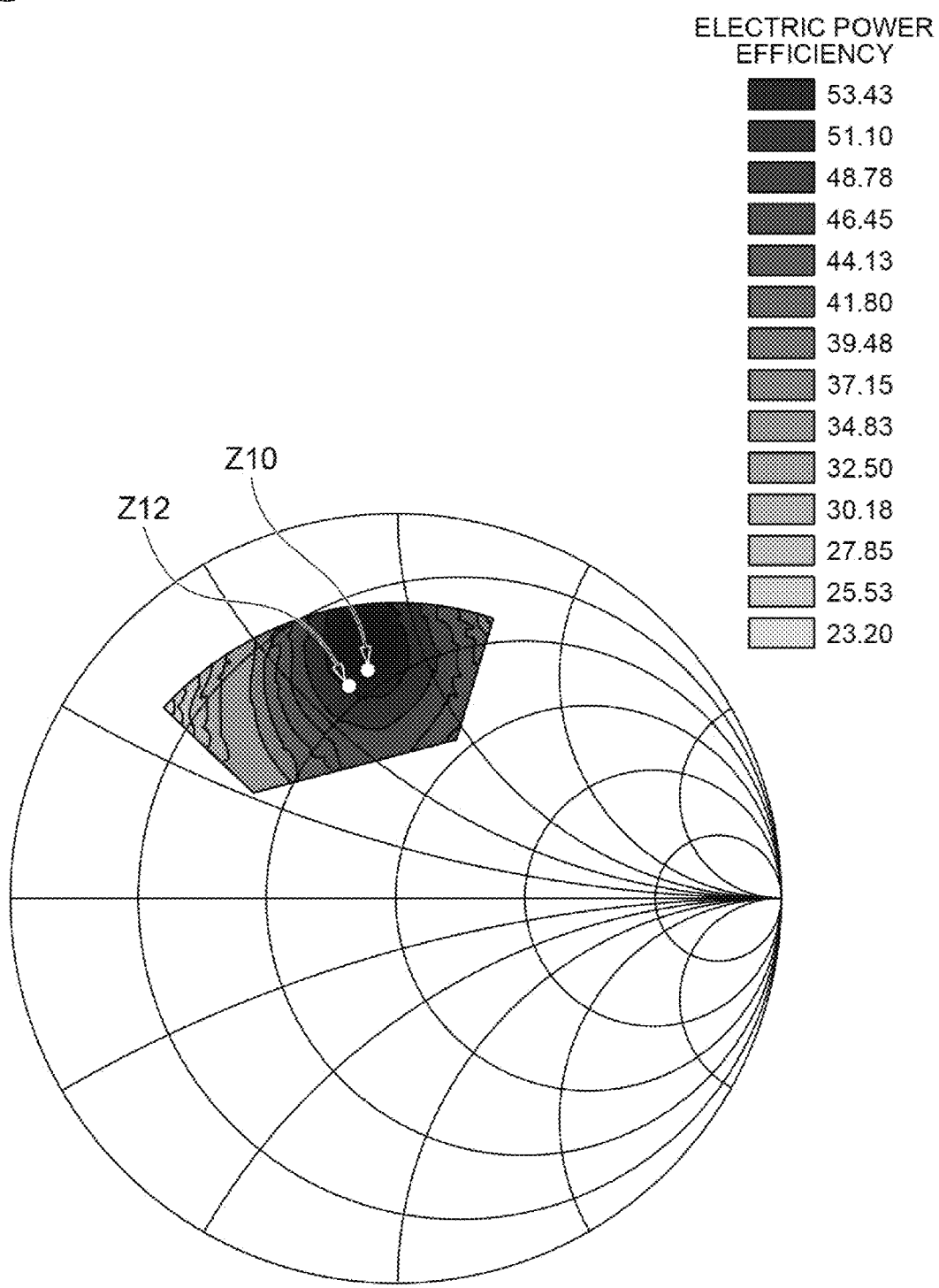
FIG. 18 is a view showing a relationship between variation in phase of a load impedance and electric power efficiency according to the second embodiment.

FIG. 18 is a view illustrating a relationship between variation in phase of a load impedance and electric power efficiency according to the second embodiment. The contour diagram of FIG. 18 illustrates that the electric power efficiency becomes higher at a darker part. Similar to FIG. 21, FIG. 18 illustrates the peak point Z10. From FIG. 18, at a point Z12 (here, 103 deg) of which the phase is shifted by approximately 4 deg with respect to the peak point Z10, it is ascertained that the electric power efficiency becomes substantially equivalent (here, approximately ηd=52.1%) to that at the peak point Z10. Therefore, it is ascertained that decrease in electric power efficiency with respect to the peak point Z10 can be curbed to be less than 1% by using the matching circuit 60.

In the foregoing embodiments, embodiments of high frequency amplifiers according to the present disclosure have been described. In the high frequency amplifiers according to the present disclosure, each of the embodiments described above can be arbitrarily changed.

For example, the high frequency amplifier 1A according to the foregoing embodiment includes two of each of the matching circuits 40 and 50, and the amplifier element portion 10 includes two amplifier elements 11, but they are not limited to this constitution. The high frequency amplifier 1A may include the matching circuits 40 and 50 one each or may include three or more matching circuits 40 and 50. The amplifier element portion 10 may include a single amplifier element 11 or may include three or more amplifier elements 11. The same also applies to the high frequency amplifier 1B. Each of the high frequency amplifiers 1A and 1B may include the matching circuit 50 or the matching circuit 60 in place of the matching circuit 40.

The number of transistors 13 and the number of bonding wires W4 are arbitrary, and the numbers thereof may be smaller than eight or may be nine or larger. The numbers of matching circuit patterns 52 and 62 and the numbers of transmission lines 54 and 64 may also be arbitrarily changed in accordance with the number of transistors 13 and the number of bonding wires W4.

In the foregoing embodiments, the matching circuit pattern 52 include two metal pads 53, but it is not limited to this constitution. The matching circuit pattern 52 may include only one metal pad 53 or may include three or more metal pads 53. The matching circuit pattern 52 may include both the metal pads 53 and 63. The same also applies to the matching circuit pattern 62.

REFERENCE SIGNS LIST 1A, 1B High frequency amplifier
2 Input terminal
3 Output terminal
4 Package
4a, 4b End wall
4c, 4d Side wall
4e Bottom plate
10 Amplifier element portion
11 Amplifier element
12 Semiconductor substrate
13, 13B, 13C Transistor
13A Transistor (first transistor)
13D Transistor (second transistor)
13E, 13F, 13G, 13H Transistor (third transistor)

14 Gate pad
15, 15B, 15C Drain pad
15A Drain pad (first drain pad)
15D Drain pad (second drain pad)
15E, 15F, 15G, 15H Drain pad (third drain pad)
16 Source pad
20 Branching circuit substrate
21 Substrate
21a, 21b Long side
21c, 21d Short side
22 Branching circuit
23 Wiring pattern
23a Metal pad
23b Film resistor
30 Synthetic circuit board
31 Substrate
31a, 31b Long side
31c, 31d Short side
32 Synthetic circuit
33 Wiring pattern
33a Metal pad
40 Matching circuit
50 Matching circuit
51 Dielectric substrate
52 Matching circuit pattern
53 Metal pad
53A Metal pad (first pad)
53B Metal pad (second pad)
53a, 53b, 53c, 53d Input end
53r, 53s, 53u, 53v Long side
53t, 53w Short side
54, 54B, 54C Transmission line
54A Transmission line (first transmission line)
54D Transmission line (second transmission line)
55a, 55b, 55c Film resistor
60, 60X Matching circuit
62, 62X Matching circuit pattern
63A Metal pad (first pad)
63B Metal pad (second pad)
63X Metal pad
63a, 63b, 63c, 63d, 63y Input end
63r, 63s, 63u, 63v Long side
63t, 63w Short side
64, 64B, 64C Transmission line
64A Transmission line (first transmission line)
64D Transmission line (second transmission line)
65a, 65b, 65c Film resistor
80 Metal conductor
80A, 80B Pattern
81, 82 Input port
83 Output port
90 Dielectric substrate
C1 Corner portion (first corner portion)
C2 Corner portion (second corner portion)
E Electromagnetic wave
D1, D2 Path
I Current value
L1, L2 Chamfering amount
L11, L12, L13, L14 Width
N1, N2, N3, N4 Virtual straight line (second virtual straight line)
N81, N82 Virtual straight line
P1, P5 Connection point (first connection point)
P4, P8 Connection point (second connection point)
P2, P3, P6, P7 Connection point
Q1, Q2, Q3, Q4 Connection point
W1, W2, W3, W5, W6 Bonding wire
W4, W42, W43 Bonding wire (wire)
W41 Bonding wire (first wire)
W44 Bonding wire (second wire)
W45, W46, W47, W48 Bonding wire (third wire)
Z10 Peak point
Z11, Z12 Point
ΔZ1, ΔZ2 Phase difference

The invention claimed is:

1. A high frequency amplifier comprising:
a first transistor, a second transistor arranged side by side with the first transistor in a first direction, and a third transistor arranged side by side with the second transistor in the first direction on a side opposite to the first transistor;
a first drain pad electrically connected to a drain electrode of the first transistor, a second drain pad electrically connected to a drain electrode of the second transistor, and a third drain pad electrically connected to a drain electrode of the third transistor;
a matching circuit pattern including a first transmission line electrically connected to the first drain pad, a second transmission line electrically connected to the second drain pad, and a third transmission line electrically connected to the third drain pad, the matching circuit pattern performing impedance matching of a radio frequency signal with respect to each of the first transistor, the second transistor, and the third transistor;
a first wire that electrically connects the first transmission line and the first drain pad to each other, a second wire that electrically connects the second transmission line and the second drain pad to each other, and a third wire that electrically connects the third transmission line and the third drain pad to each other; and
a wiring pattern electrically connected to the first drain pad via the first transmission line and the first wire and electrically connected to the second drain pad via the second transmission line and the second wire;
wherein:
the first wire and the second wire are disposed at different heights from a principal surface of a substrate such that an effective impedance of the second wire is larger than an effective impedance of the first wire;
the matching circuit pattern has an asymmetrical external shape with respect to a second virtual straight line orthogonal to a first virtual straight line connecting a first connection point having the first wire connected thereto in the first transmission line and a second connection point having the second wire connected thereto in the second transmission line to each other and passing through a median point between the first connection point and the second connection point; and
an electrical length of the second transmission line is shorter than an electrical length of the first transmission line.

2. The high frequency amplifier according to claim 1, wherein the matching circuit pattern includes a first pad including a first corner portion and a second pad including a second corner portion,
wherein the first transmission line is constituted of a part including the first corner portion in the first pad,
wherein the second transmission line is constituted of a part including the second corner portion in the second pad, and wherein the second corner portion is chamfered by a chamfering amount larger than a chamfering amount of the first corner portion.

3. The high frequency amplifier according to claim 1, wherein the first transmission line is thinner than the second transmission line.

4. The high frequency amplifier according to claim 1, wherein a plurality of transistor groups each including the first transistor, the second transistor, and the third transistor are provided.

5. The high-frequency amplifier according to claim 4, wherein the first wire is disposed at an outermost part of the transistor groups and the second wire is disposed between the third wire and the first wire, wherein a physical length of the first wire is greater than a physical length of the second wire by an amount that compensates for the shorter electrical length of the second transmission line relative to the first transmission line, such that a sum of (i) an effective electrical length of the first wire and an electrical length of the first transmission line is substantially equivalent to a sum of (ii) an effective electrical length of the second wire and an electrical length of the second transmission line, and wherein an effective electrical length from the first drain pad to the wiring pattern is therefore substantially equivalent to an effective electrical length from the second drain pad to the wiring pattern.

* * * * *